United States Patent
Chen et al.

(10) Patent No.: US 9,450,093 B2
(45) Date of Patent: Sep. 20, 2016

(54) SEMICONDUCTOR DEVICE STRUCTURE AND MANUFACTURING METHOD THEREOF

(71) Applicant: TAIWAN SEMICONDUCTOR MANUFACTURING COMPANY LTD., Hsinchu (TW)

(72) Inventors: I-Chih Chen, Tainan (TW); Chih-Ming Hsieh, Changhua County (TW); Fu-Tsun Tsai, Tainan (TW); Yung-Fa Lee, Tainan (TW); Chih-Mu Huang, Tainan (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 0 days.

(21) Appl. No.: 14/515,225

(22) Filed: Oct. 15, 2014

(65) Prior Publication Data

US 2016/0111536 A1   Apr. 21, 2016

(51) Int. Cl.
*H01L 29/78* (2006.01)
*H01L 29/66* (2006.01)
*H01L 21/265* (2006.01)
*H01L 21/324* (2006.01)

(52) U.S. Cl.
CPC ......... *H01L 29/7848* (2013.01); *H01L 21/265* (2013.01); *H01L 21/324* (2013.01); *H01L 29/66795* (2013.01); *H01L 29/785* (2013.01)

(58) Field of Classification Search
CPC ............ H01L 2924/00; H01L 2924/00013; H01L 2924/01047; H01L 29/78; H01L 21/265; H01L 21/324; H01L 29/66

USPC .......... 438/197, 622, 637, 638, 468
See application file for complete search history.

(56) References Cited

U.S. PATENT DOCUMENTS

| | | |
|---|---|---|
| 2011/0180847 A1 | 7/2011 | Ikeda |
| 2012/0074464 A1 | 3/2012 | Cea |
| 2013/0200455 A1* | 8/2013 | Lo ............ H01L 29/66795 257/347 |
| 2013/0228862 A1 | 9/2013 | Lee |
| 2013/0277746 A1 | 10/2013 | Baldauf et al. |
| 2014/0131812 A1 | 5/2014 | Wu et al. |

FOREIGN PATENT DOCUMENTS

TW    201334045 X    8/2013

OTHER PUBLICATIONS

Office Action issued on Jul. 2, 2015 by the German Patent Office for corresponding German application 10 2014 119 637.6.

(Continued)

*Primary Examiner* — Chuong A Luu
*Assistant Examiner* — Rodolfo Fortich
(74) *Attorney, Agent, or Firm* — WPAT, P.C., Intellectual Property Attorneys; Anthony King

(57) ABSTRACT

Some embodiments of the present disclosure provide a method of manufacturing a semiconductor device including receiving a FinFET precursor including a fin structure formed between isolation regions, and a gate structure formed over a portion of the fin structure such that a sidewall of the fin structure is in contact with a gate spacer of the gate structure; patterning the fin structure to comprise a pattern of at least one upward step rising from the isolation region; forming a capping layer over the fin structure, the isolation region, and the gate structure; performing an annealing process on the FinFET precursor to form at least two dislocations along the upward step; and removing the capping layer.

20 Claims, 43 Drawing Sheets

(56) References Cited

OTHER PUBLICATIONS

English abstract translation of the Office Action issued on Jul. 2, 2015 by the German Patent Office for corresponding German application 10 2014 119 637.6.

Office Action issued on Jul. 1, 2016 by the Taiwan Patent Office for corresponding Taiwan application 104108585.
Search report issued on Jul. 1, 2016 by the Taiwan Patent Office for corresponding Taiwan application 104108585.

\* cited by examiner

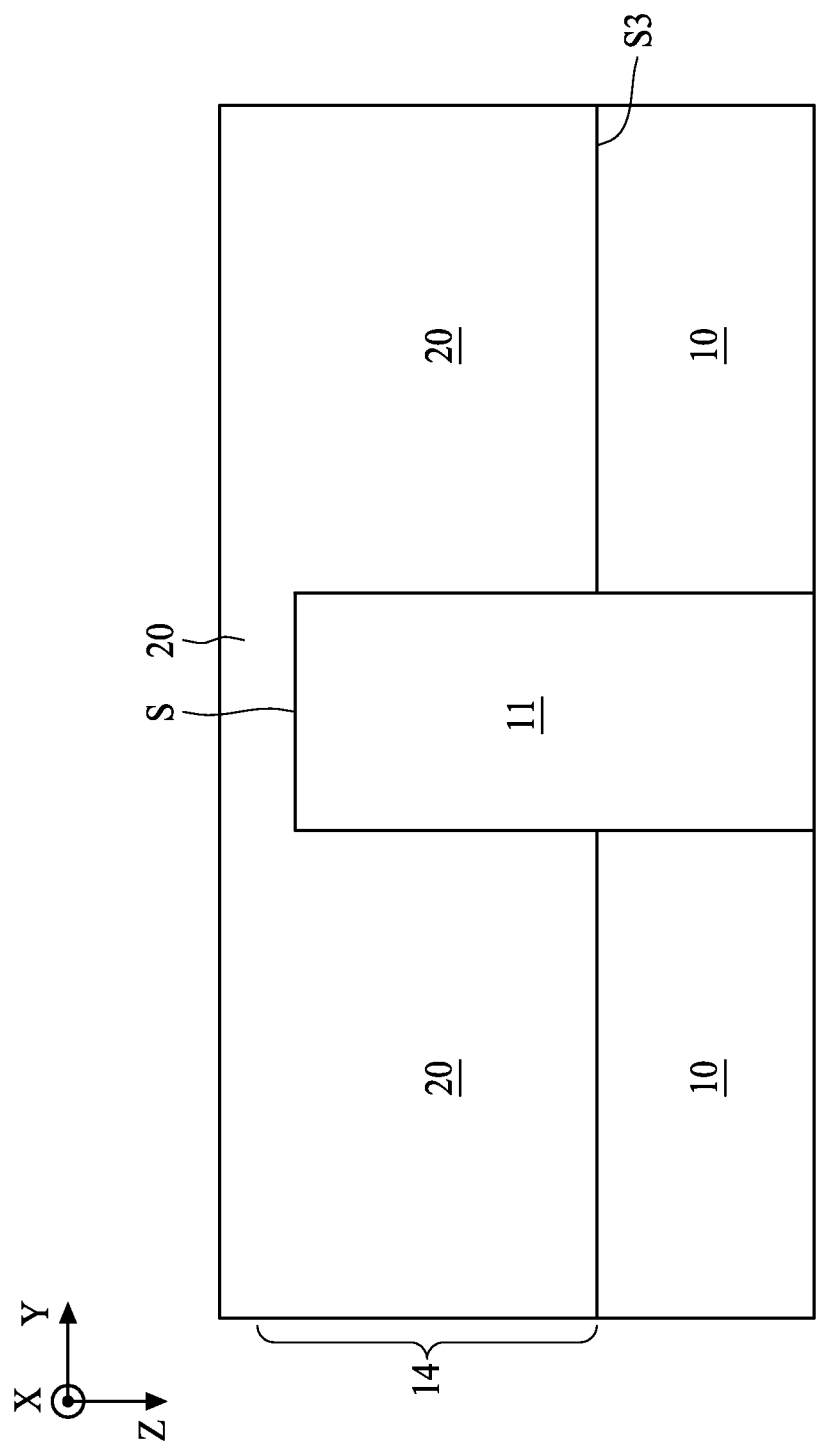

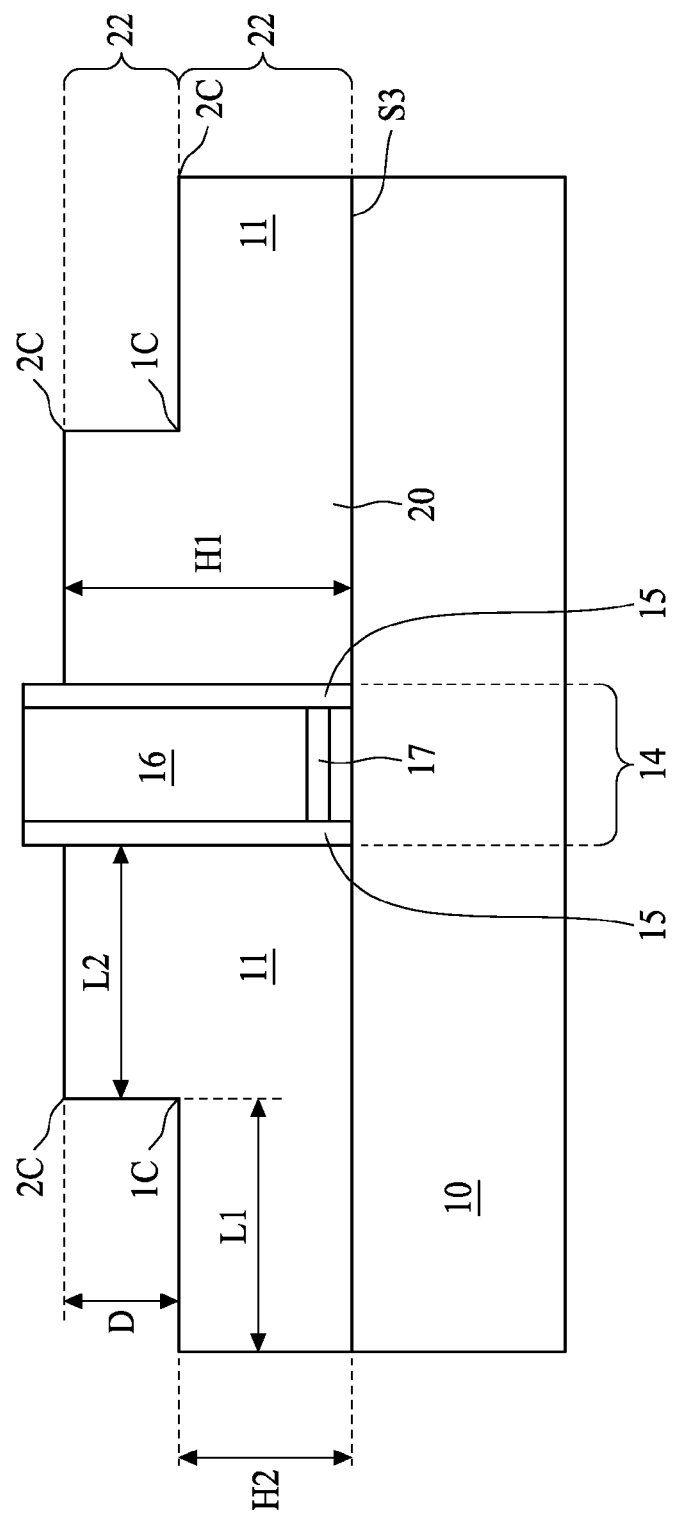

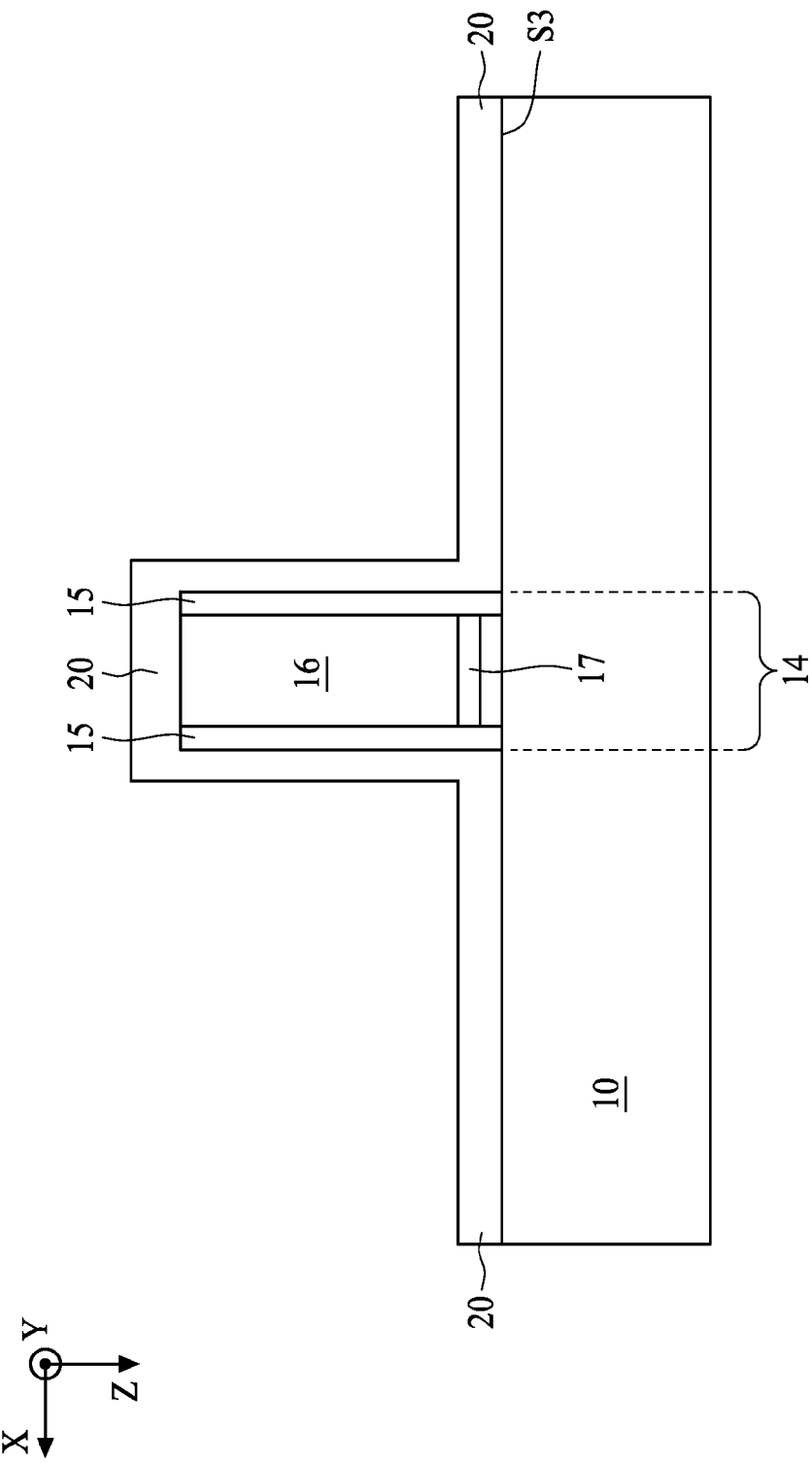

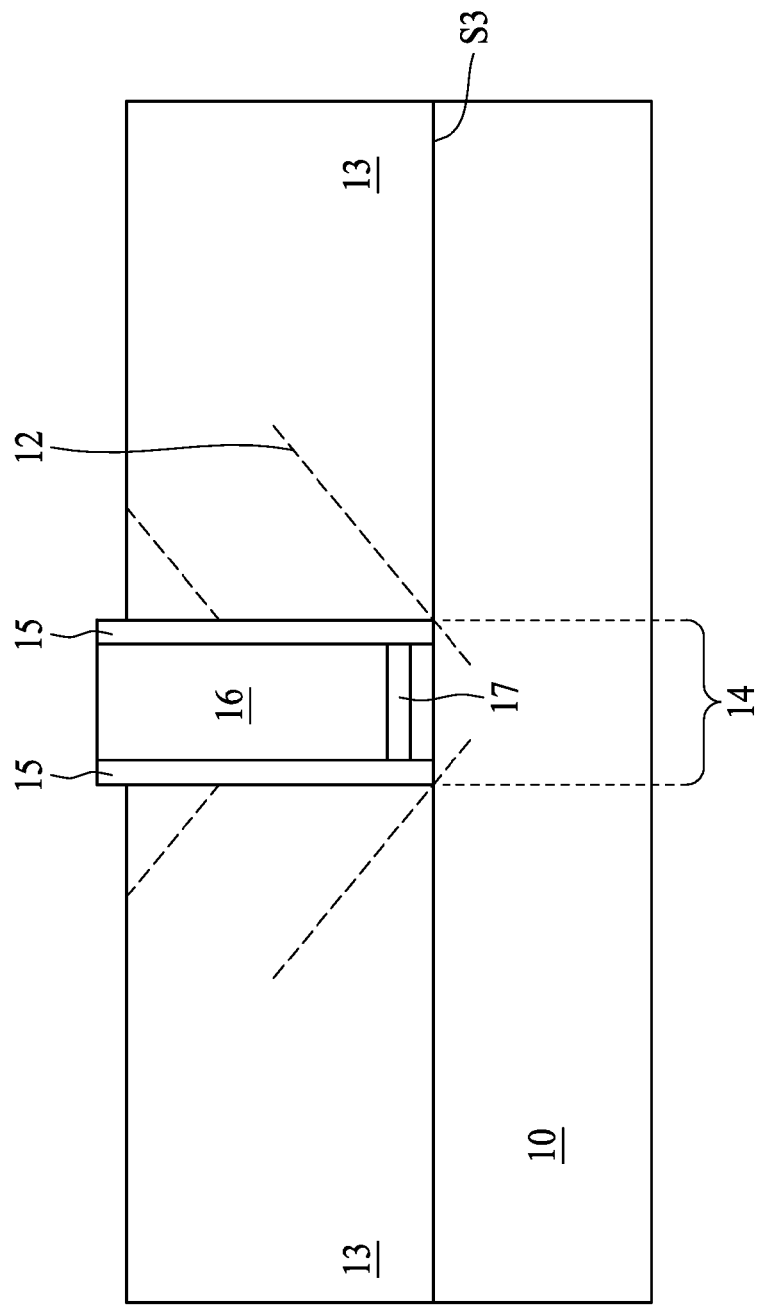

SEMICONDUCTOR DEVICE STRUCTURE AND MANUFACTURING METHOD THEREOF

BACKGROUND

A fin-like field effect transistor (FinFET) is fabricated with a thin "fin" (or fin structure) extending from a substrate. A channel of the FET is formed in this fin. A gate (or gate structure) is provided over the fin. The gate controls the channel in the fin.

To enhance a performance of the FinFET, stress is introduced into the channel regions to improve carrier mobility. Generally, a tensile stress is induced in the channel region of an n-type FinFET, and a compressive stress is induced in the channel region of a p-type FinFET.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 4X, 4Y, and 4Z are some cross-sectional views and a top view of an operation in a method for manufacturing a semiconductor device, in accordance with some embodiments.

FIGS. 6Y and 6X are some cross-sectional views of an operation in a method for manufacturing a semiconductor device, in accordance with some embodiments.

FIGS. 15X and 15Y are some cross-sectional views of an operation in a method for manufacturing a semiconductor device, in accordance with some embodiments.

FIGS. 19Y and 19X are some cross-sectional views of an operation in a method for manufacturing a semiconductor device, in accordance with some embodiments.

DETAILED DESCRIPTION

Figure 1:
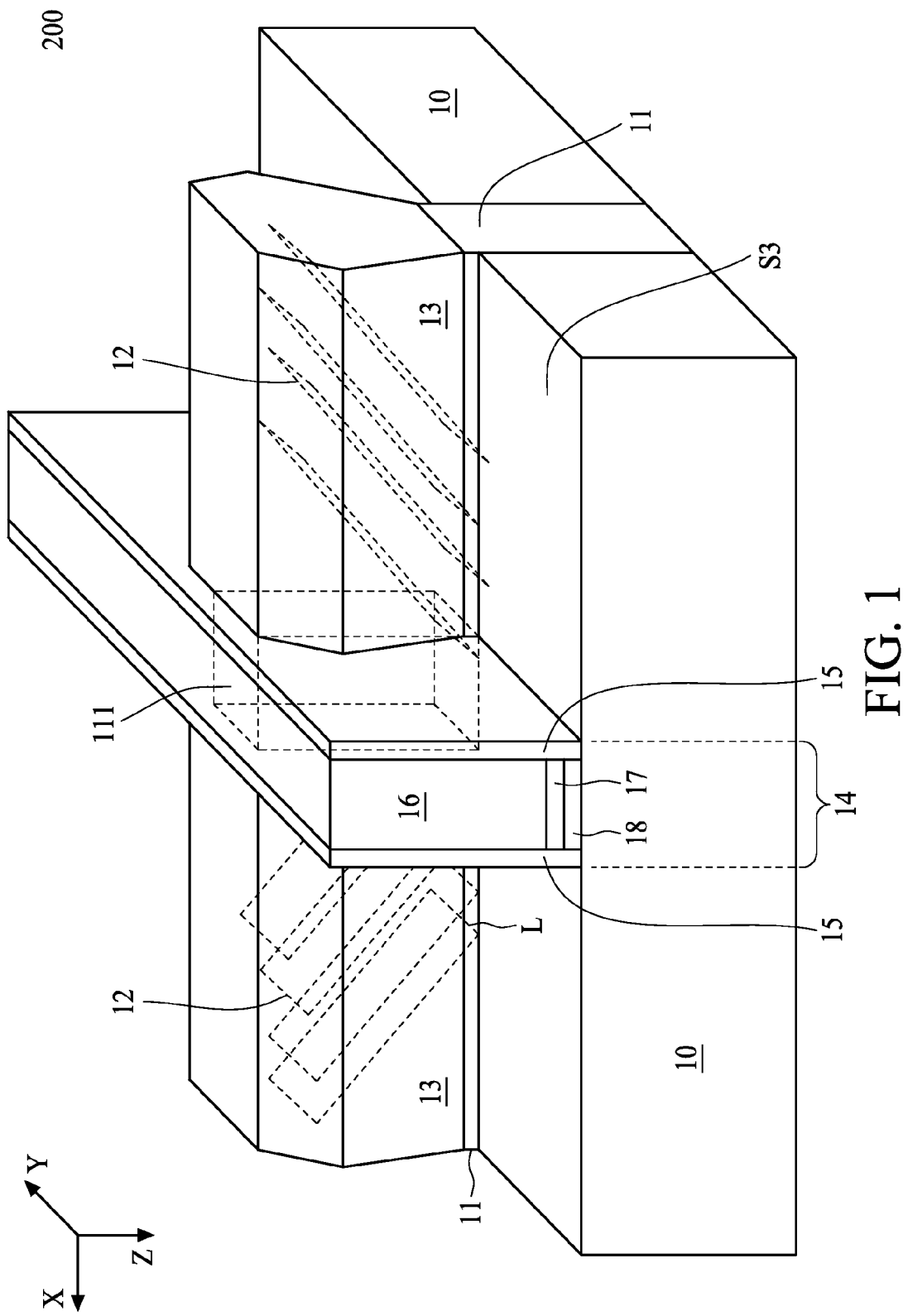
FIG. 1 is a diagrammatic perspective view of a semiconductor device, in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

A Fin Field-Effect Transistor (FinFET) with a dislocation therein and a method of forming the same are provided in accordance with various embodiments. Some intermediate operations of forming the FinFET are illustrated. Some variations of the embodiments are discussed. Throughout some various views and illustrative embodiments, like reference numbers are used to designate like elements.

Figure 3:
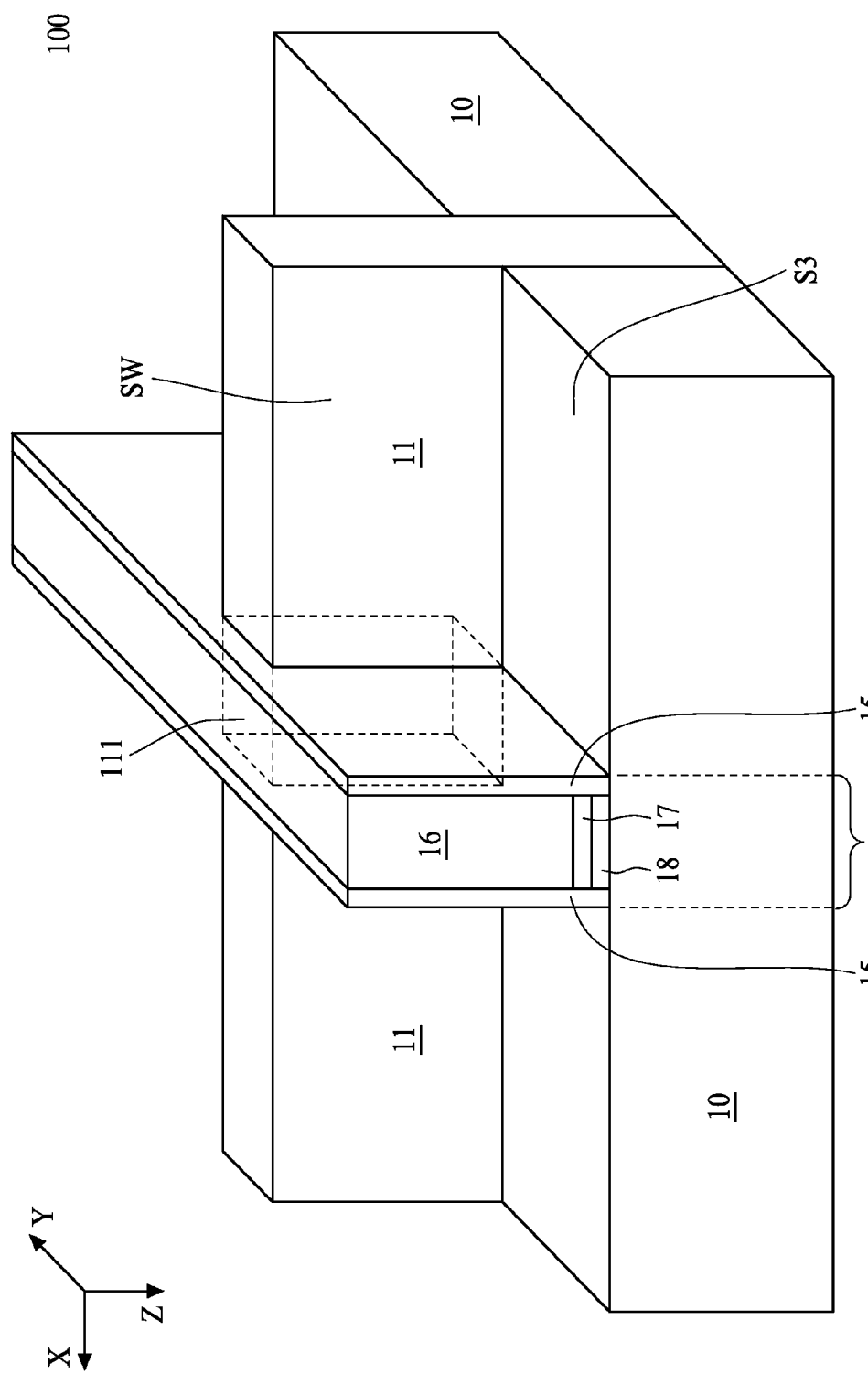
FIG. 3 is a diagrammatic perspective view of a FinFET precursor, in accordance with some embodiments of the present disclosure.
Figure 3Y:
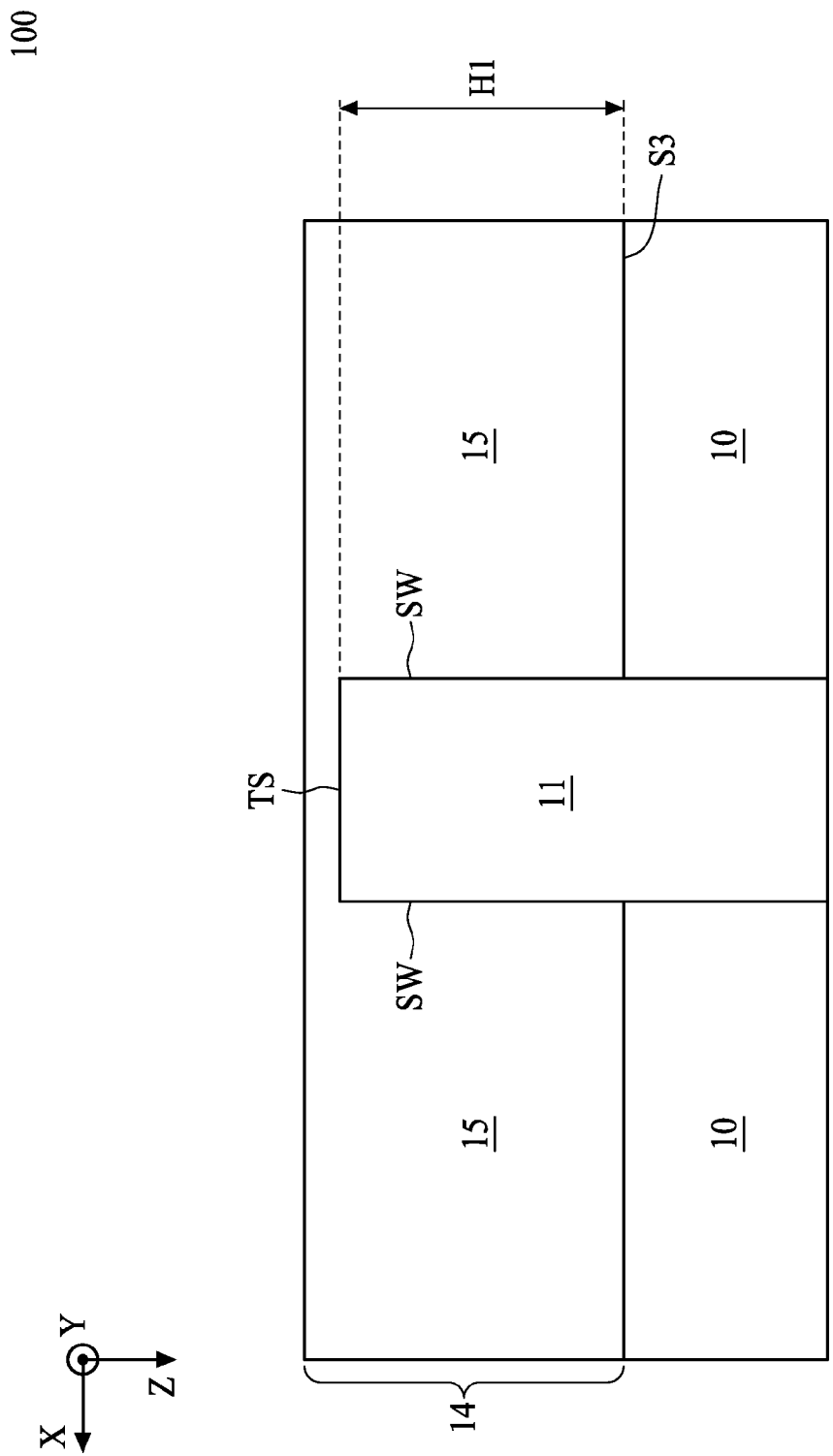
FIGS. 3X, 3Y, and 3Z are some cross-sectional views and a top view of an operation in a method for manufacturing a semiconductor device, in accordance with some embodiments.
Figure 3X:
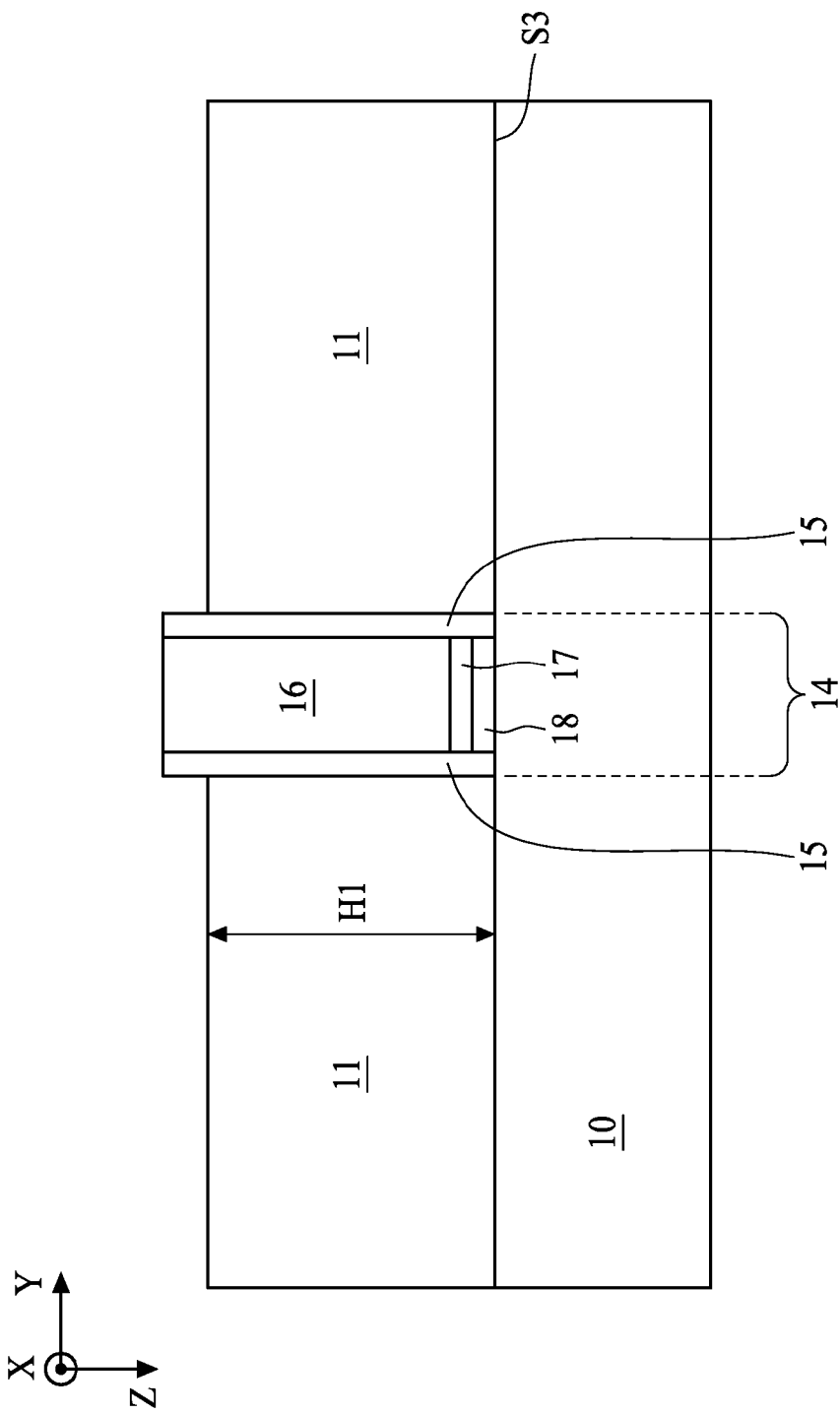
Figure 8Y:
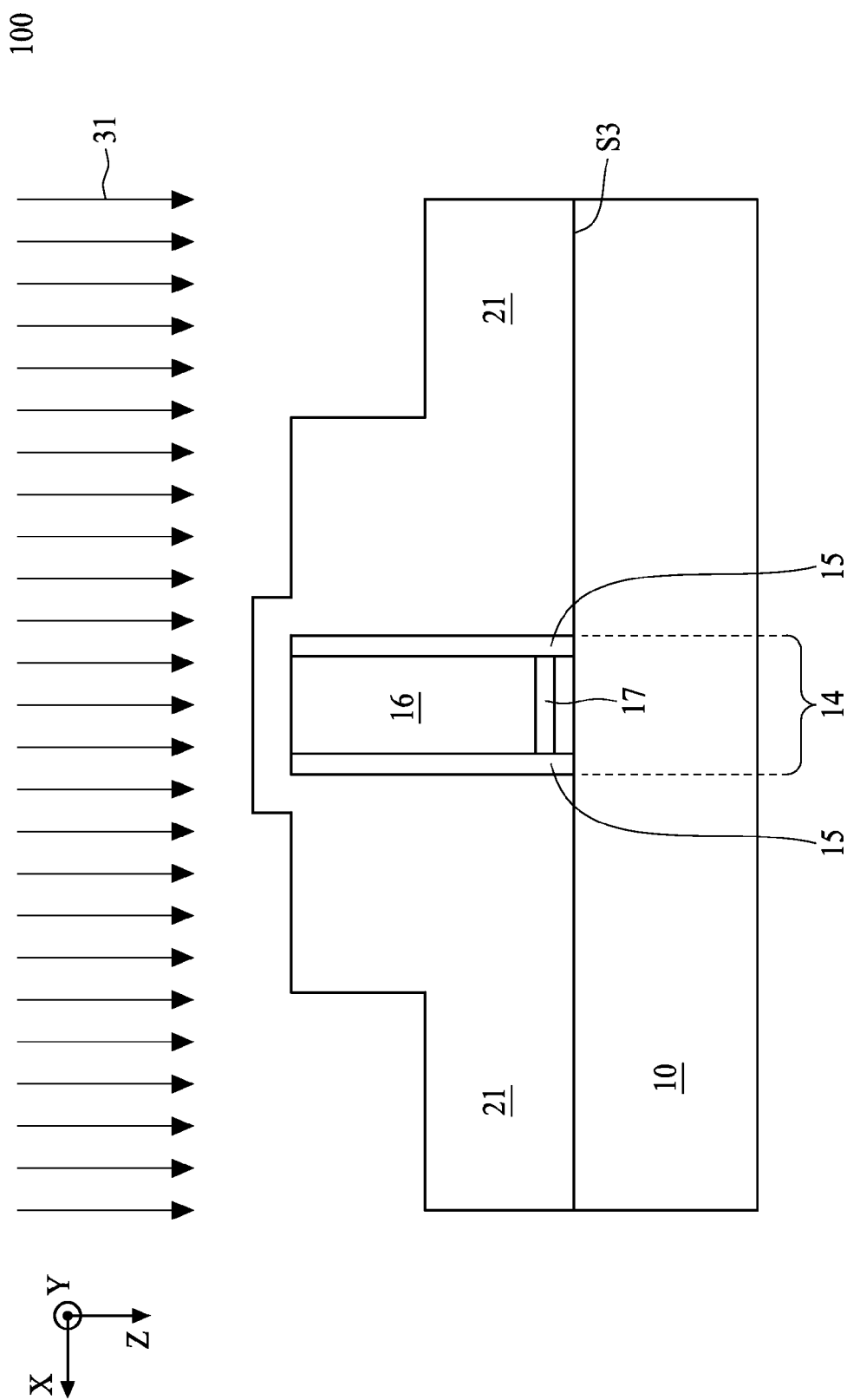
FIGS. 8X and 8Y are some cross-sectional views of an operation in a method for manufacturing a semiconductor device, in accordance with some embodiments.
Figure 8X:
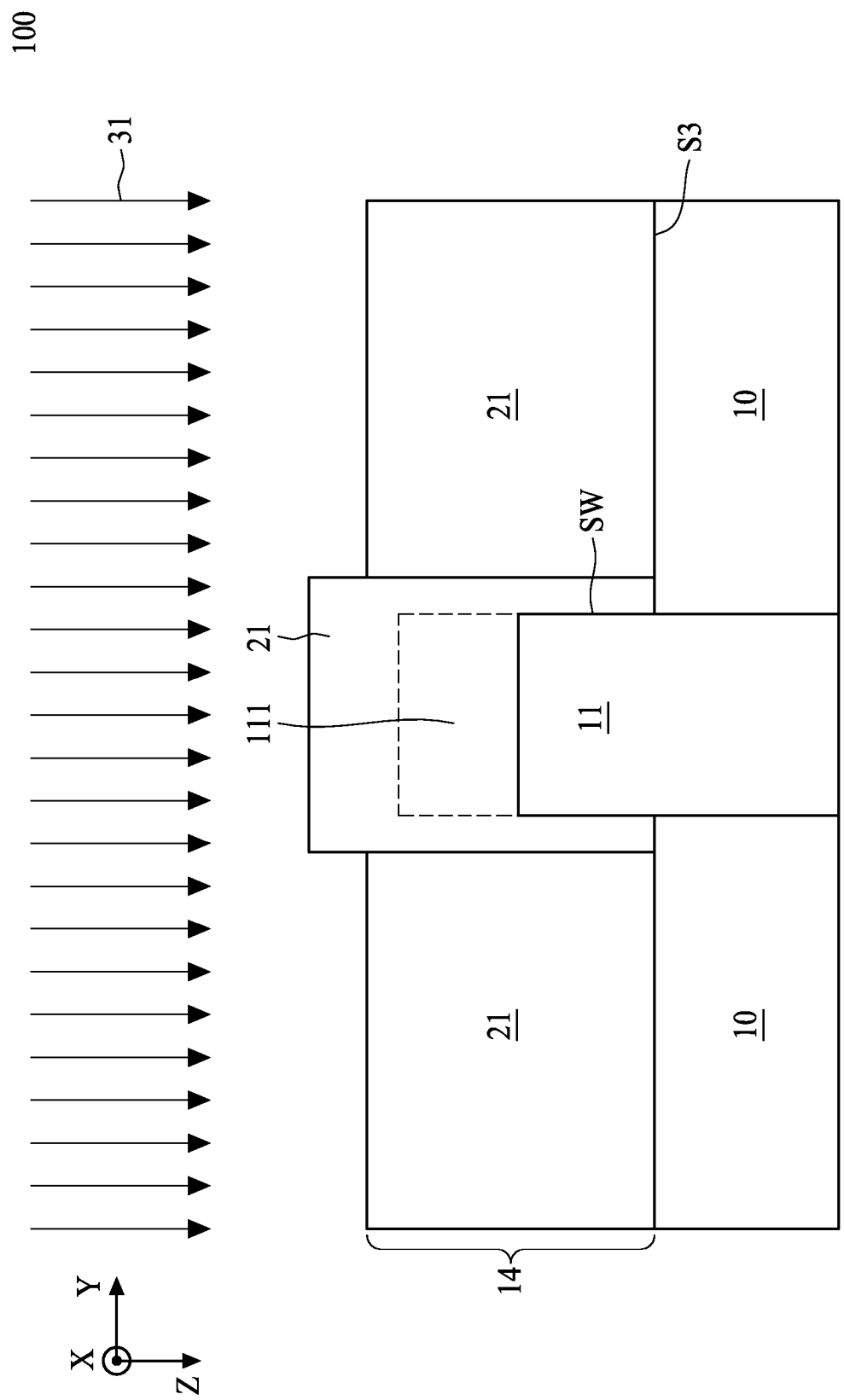
Figure 9Y:
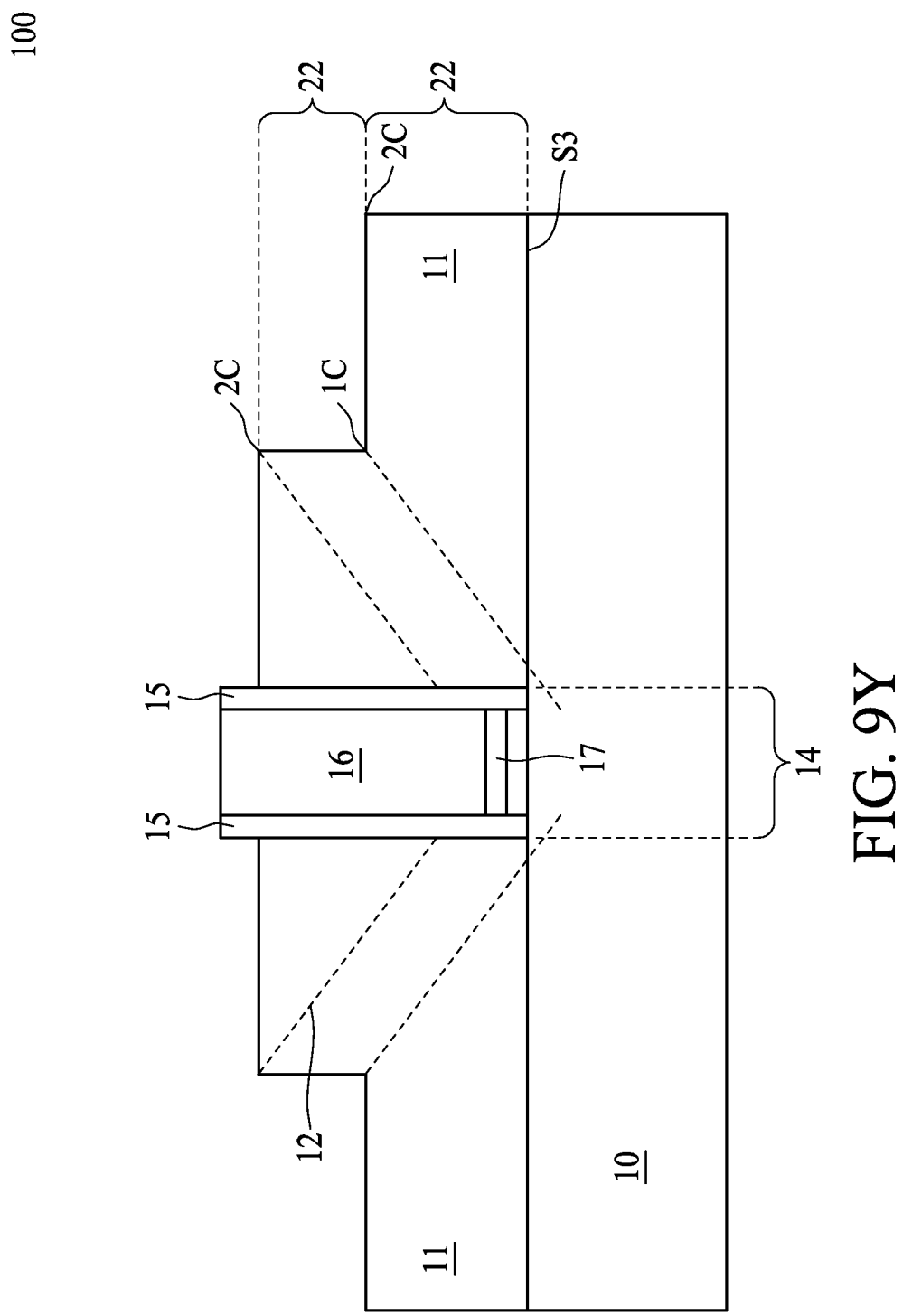
FIGS. 9X and 9Y are some cross-sectional views of an operation in a method for manufacturing a semiconductor device, in accordance with some embodiments.
Figure 9X:
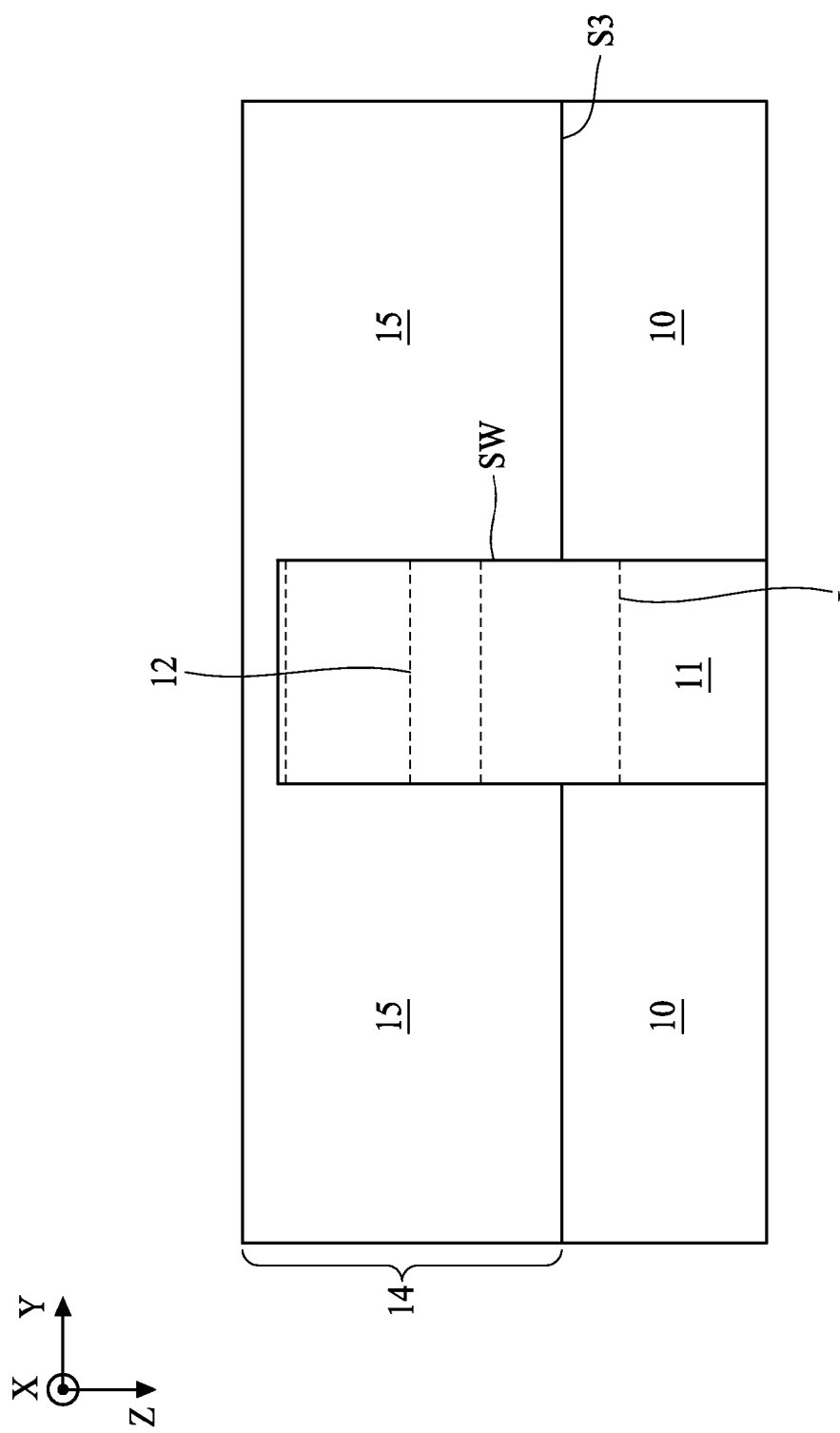
Figure 9:
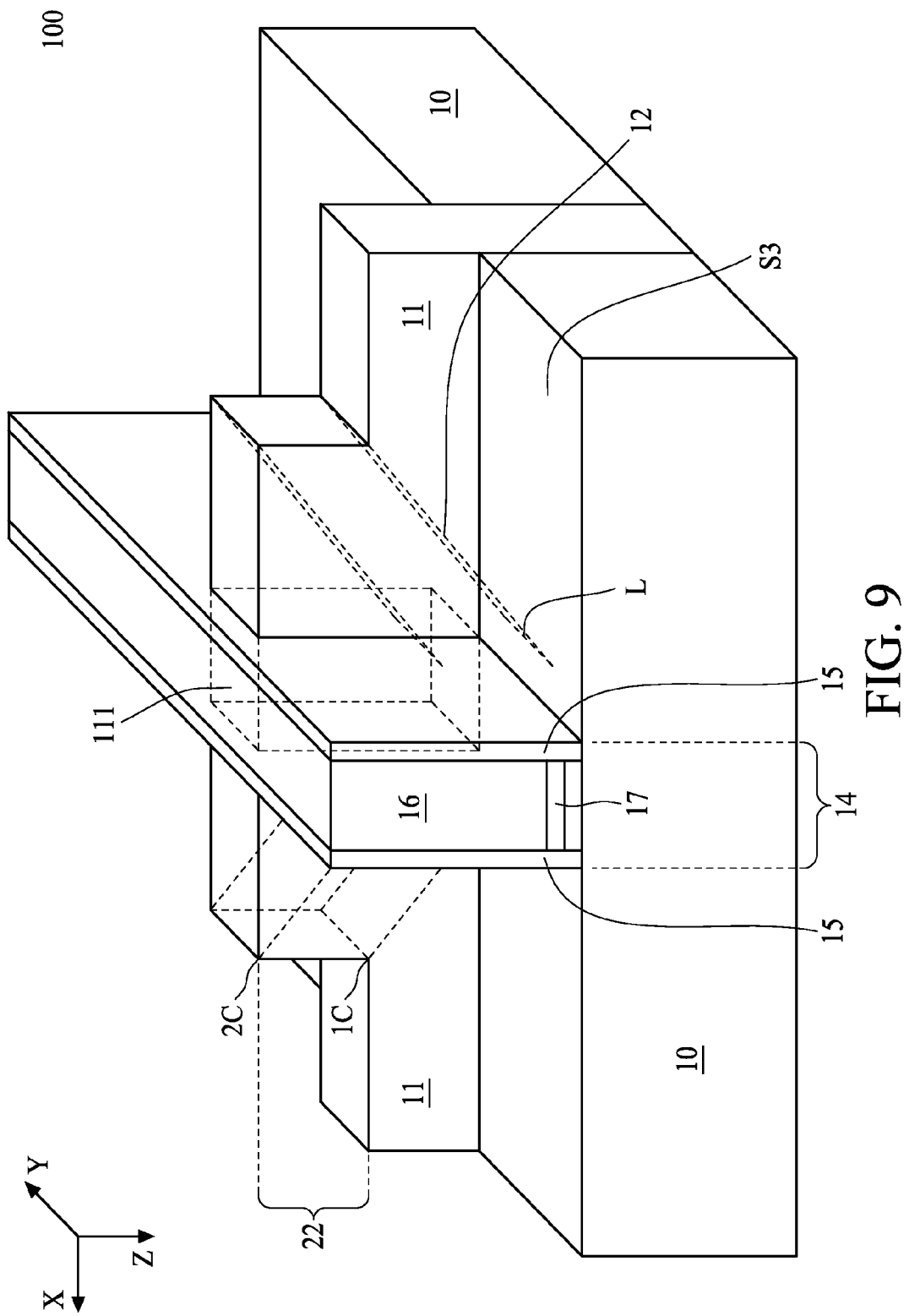
FIG. 9 is a diagrammatic perspective view of an operation in a method for manufacturing a semiconductor device, in accordance with some embodiments of the present disclosure.
Figure 11Y:
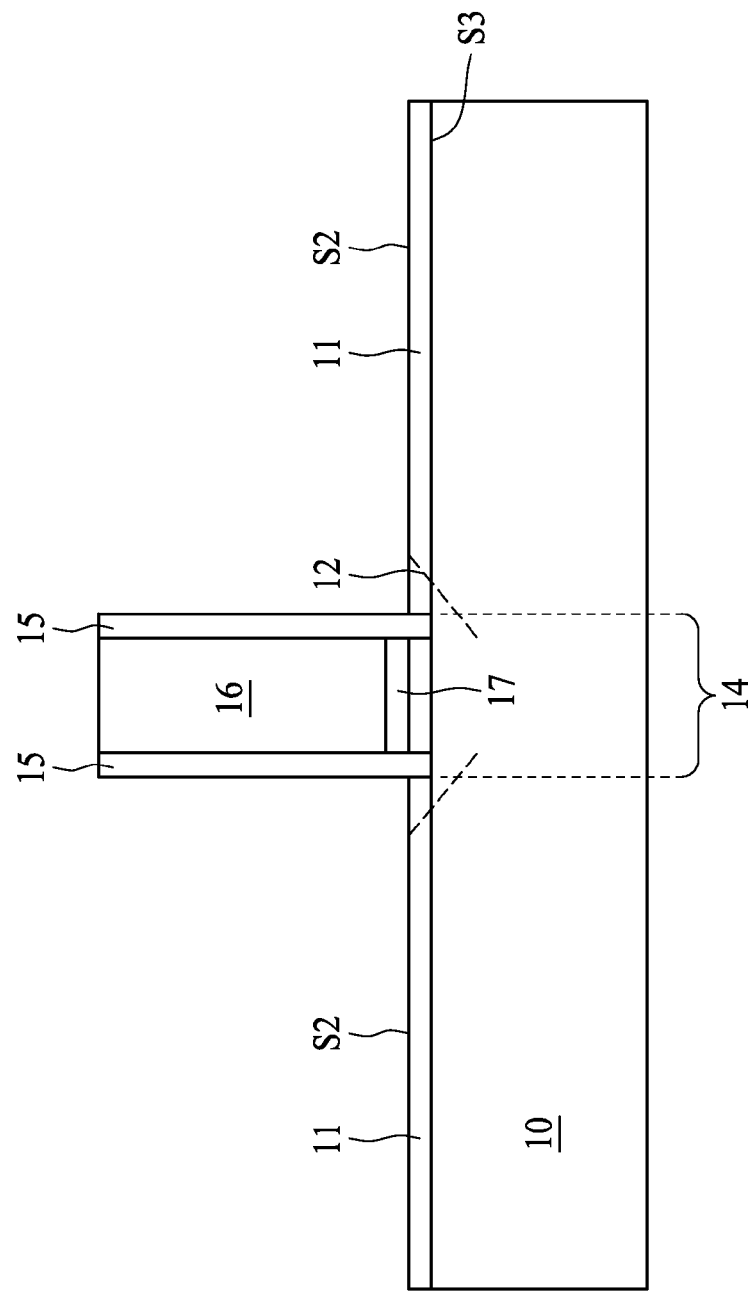
FIGS. 11X and 11Y are some cross-sectional views of an operation in a method for manufacturing a semiconductor device, in accordance with some embodiments.
Figure 11X:
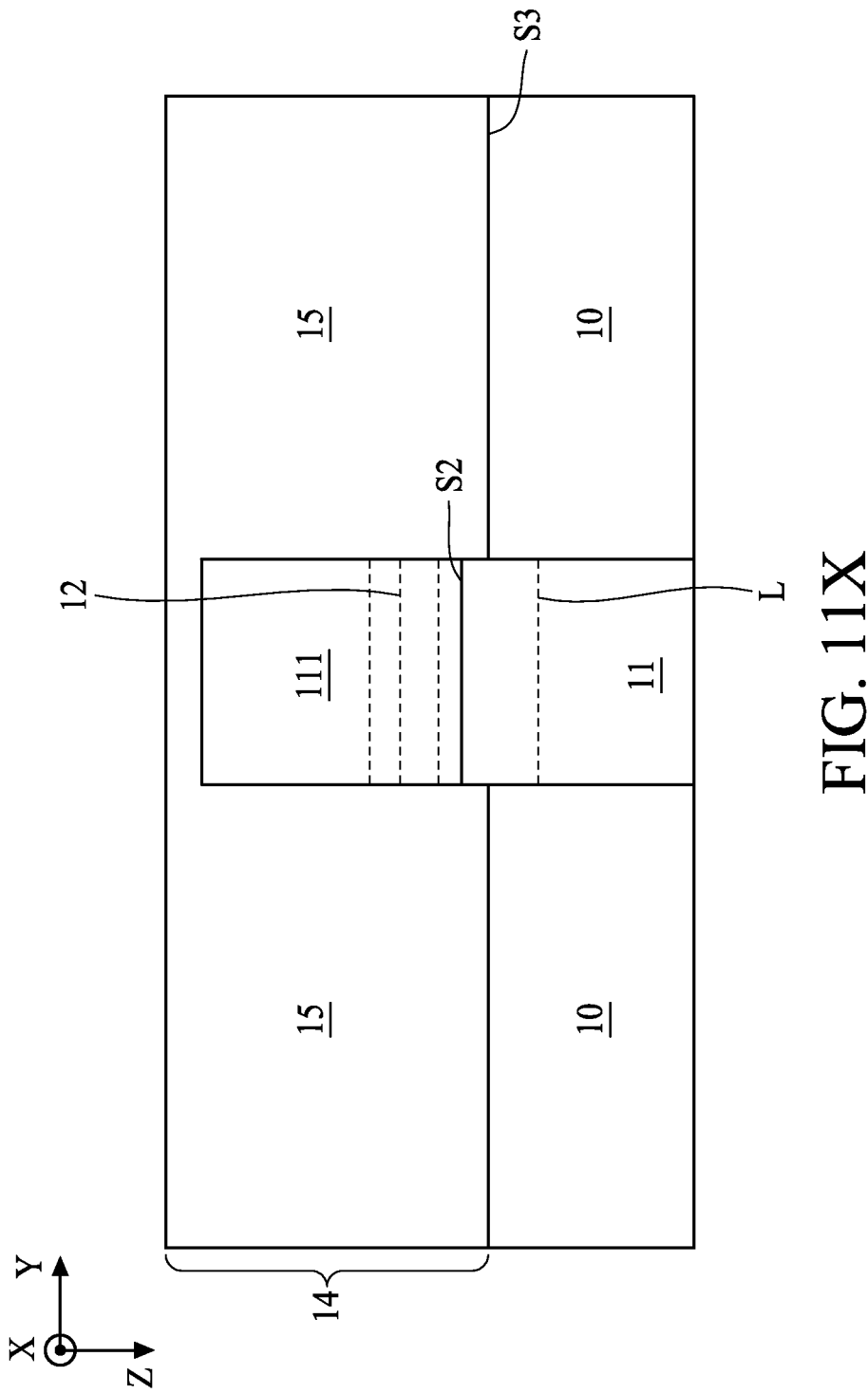
Figure 12:
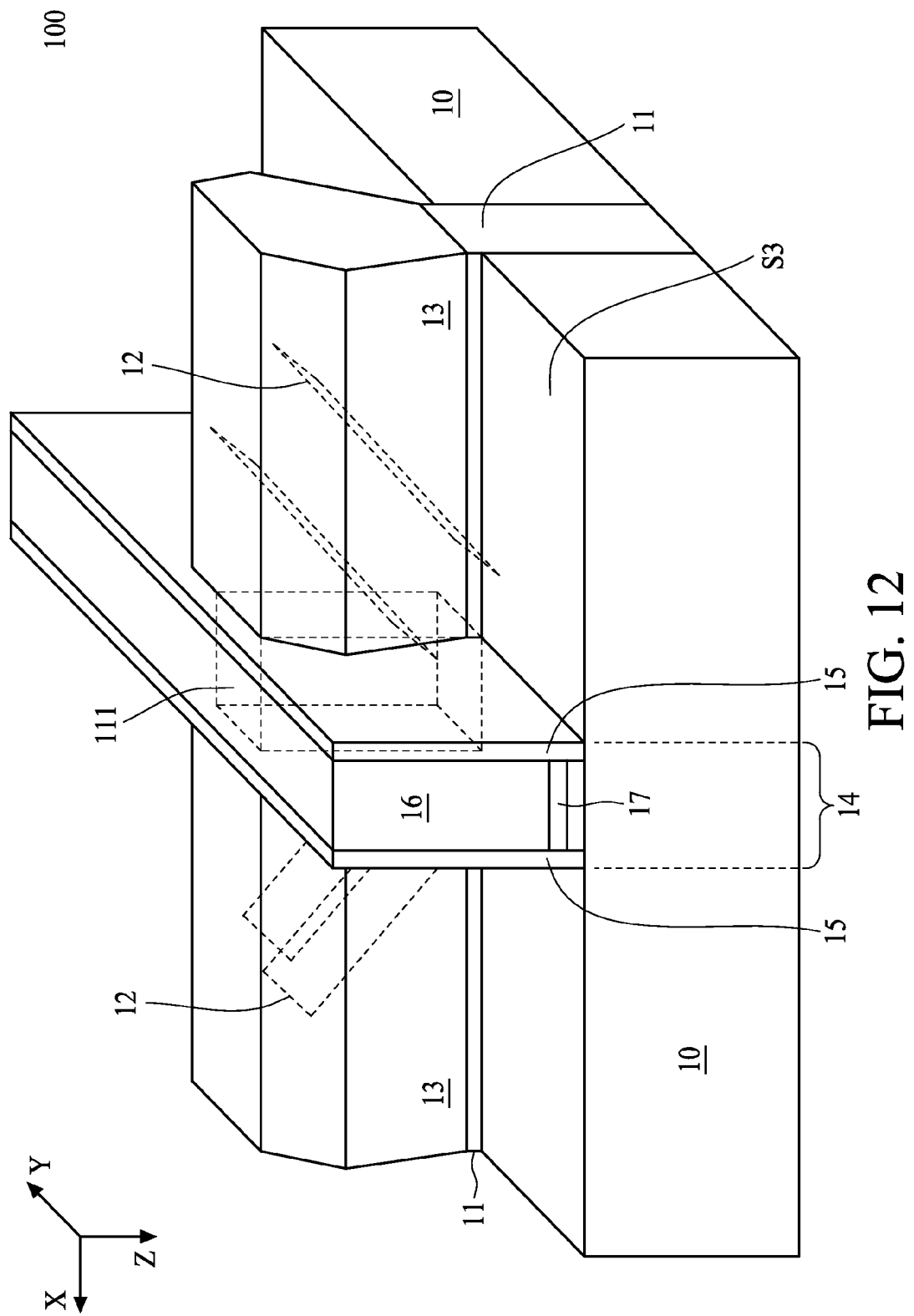
FIG. 12 is a diagrammatic perspective view of an operation in a method for manufacturing a semiconductor device, in accordance with some embodiments of the present disclosure.
Figure 12Y:
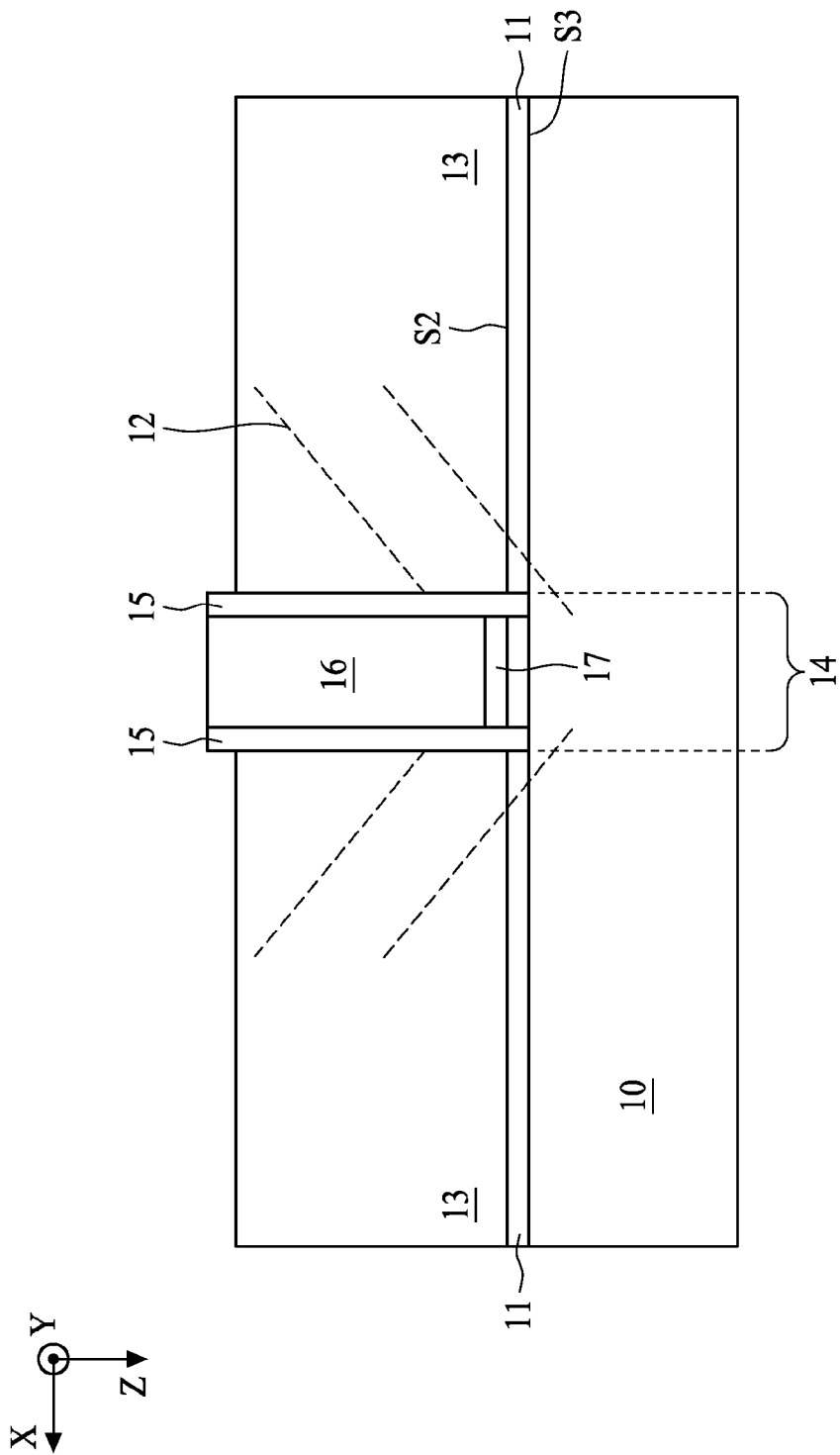
FIGS. 12X, 12Y, and 12Z are some cross-sectional views and a top view of an operation in a method for manufacturing a semiconductor device, in accordance with some embodiments.

FIGS. 3, 9, and 12 are some diagrammatic perspective views of a FinFET precursor 100 according to some embodiments of the present disclosure. FIGS. 3X, 3Y, 3Z, 4X, 4Y, 4Z, 5Y, 6Y, 7X, 7Y, 8X, 8Y, 9X, 9Y, 10X, 10Y, 11X, 11Y, 12X, 12Y, and 12Z are some cross-sectional views of a FinFET precursor 100 according to some embodiments of the present disclosure. FIGS. 14Y, 15X, 15Y, 16X, 16Y, 17X, 17Y, 18X, 18Y, and 19Y are some cross-sectional views of a FinFET precursor 100 according to some other embodiments of the present disclosure. The method 400 and the FinFET precursor 100 are collectively described with reference to FIG. 3 through FIG. 12. The method 401 and the FinFET precursor 100 are collectively described with reference to FIG. 14Y through FIG. 19Y. It is understood that additional operations can be provided before, during, and after the method 400 and 401, and some of the operations described can be repeated, replaced or eliminated for some other embodiments of the methods.

FIG. 1 illustrates a diagrammatic perspective view of a semiconductor device 200. The semiconductor device 200 is a FinFET structure. A coordinate system with arrows pointing in three directions X, Y, and Z is illustrated. Direction X, direction Y, and direction Z are orthogonal to each other. Direction X is in a gate-length and a fin-width direction. Direction Y is in a gate-width direction. Direction Z is a direction for a top viewing. Unless specified otherwise, throughout the description, the cross-sectional views in FIGS. 3X, 4X, 5X, 6X, 7X, 8X, 9X, 10X, 11X, 12X, 15X, 16X, 17X, 18X and 19X are obtained from a view looking in a direction X, whose figure numbers include a letter "X". Unless specified otherwise, throughout the description, the cross-sectional views in FIGS. 3Y, 4Y, 5Y, 6Y, 7Y, 8Y, 9Y, 10Y, 11Y, 12Y, 14Y, 15Y, 16Y, 17Y, 18Y, and 19Y are obtained from a view looking in a direction Y, whose figure numbers include a letter "Y". Unless specified otherwise, throughout the description, the cross-sectional views in FIGS. 3Z, 4Z, 10Z and 12Z are obtained from a view looking in a direction Z, whose figure numbers include a letter "Z".

In FIG. 1, semiconductor device 200 includes a fin structure 11, an isolation region 10, a gate structure 14, a gate spacer 15, a gate electrode layer 16, a gate dielectric layer 17, an interfacial layer 18, some epitaxy regions 13, and some dislocations 12.

Isolation region 10 is under gate structure 14, and is next to a lower portion of fin structure 11.

Exemplary isolation region 10 utilizes an isolation technology, such as shallow trench isolation (STI), to define and electrically isolate various regions such as fin structure 11. The isolation region 10 is composed of silicon oxide, silicon nitride, silicon oxynitride, an air gap, other suitable materials, or combinations thereof.

Fin structure 11 is between isolation regions 10. Fin structure 11 is elongated to include a first longitudinal axis, which is in a same direction as direction X. A portion of fin structure 11 is above isolation region 10. Fin structure 11 is continuous on either side of gate structure 14. A portion 111 of fin structure 11 is covered by gate structure 14 and in contact with gate spacer 15. In some embodiments, the portion 111 is a channel region of a FinFET. A lower portion of dislocation 12 is in fin structure 11.

Fin structure 11 is made of any suitable material including silicon and silicon germanium. The fin structure 204 includes various doped regions. For example, the doped regions include a lightly doped source/drain (LDD) region (not shown) and a source/drain (S/D) region (not shown). The S/D regions are doped with a p-type dopant, an n-type dopant, and/or combinations thereof. The p-type dopants include boron or BF2; n-type dopants include phosphorus or arsenic. Doping specie is selected based on a type of device, such as an n-type FinFET device or a p-type FinFET device. The S/D regions can include various doping profiles.

Gate structure 14 is overlying on top of isolation region 10 and fin structure 11. Gate structure 14 is elongated to include a second longitudinal axis, which is in a same direction as direction Y. Gate structure 14 is over the portion 111 of the fin structure 11. Portion 111 is illustrated using dashed lines since portion 111 is inside gate structure 14. A top side and sidewalls SW of portion 111 are in contact with gate structure 14. Portion 111 of the fin structure 11 is in contact with a gate spacer 15. A portion of gate structure 14 is in contact with epitaxy region 13 proximate to the portion 111 of the fin structure 11. Gate structure 14 is continuous on either side of fin structure 11. Some lower portions of dislocations 12 are in the portion 111 of the fin structure 11 and some portions of fin structure 11 between isolation regions 10. Gate structure 14 includes interfacial layer 18 at a bottom, gate dielectric layer 17 on top of interfacial layer 18, gate electrode layer 16 on top of gate dielectric layer 17, and some gate spacer 15 at either side of gate structure 14. A gate stack includes interfacial layer 18, gate dielectric layer 17, and gate electrode layer 16.

An exemplary interfacial layer 18 includes silicon oxide (e.g., thermal oxide or chemical oxide) and/or silicon oxynitride (SiON). The gate dielectric layer 17 is positioned over the interfacial layer 18. The gate dielectric layer 17 includes a dielectric material, such as silicon oxide, silicon nitride, silicon oxynitride, high-k dielectric material, other suitable dielectric material, and/or combinations thereof. Examples of high-k dielectric material includes HfO2, HfSiO, HfSiON, HfTaO, HfTiO, HfZrO, Zirconium oxide, aluminum oxide, hafnium dioxide-alumina (HfO2-Al2O3) alloy, other suitable high-k dielectric materials, and/or combinations thereof. The gate electrode layer 16 is over the gate dielectric layer 17. The gate electrode layer 16 includes any suitable material, such as polysilicon, aluminum, copper, titanium, tantalum, tungsten, molybdenum, tantalum nitride, nickel silicide, cobalt silicide, TiN, WN, TiAl, TiAlN, TaCN, TaC, TaSiN, metal alloys, other suitable materials, and/or combinations thereof. Gate spacer 15 is positioned on each side of the gate stack. Gate spacer 15 is composed of a nitride material (e.g., silicon nitride), a dielectric material such as silicon nitride, silicon nitride doped with carbon, silicon carbide, silicon oxide, silicon oxynitride, silicon oxynitride doped with carbon, other suitable materials, and/or combinations thereof. It is understood that the gate structure 14 can comprise additional layers such as diffusion/barrier layers (not shown), conductive layers (not shown), other suitable layers, and/or combinations thereof.

The epitaxy region 13 is covering on top of fin structure 11. Epitaxy region 13 is discontinuous on either side of gate structure 14. Epitaxy region 13 is elongated in a same direction as direction X. A plurality of dislocations 12 is inside epitaxy region 13. Epitaxy region 13 includes a surface in a polygonal shape. The surface is orthogonal to direction X. A portion of the surface is in contact with gate spacer 15 on either side of gate structure 14.

The epitaxy region 13 is made of some semiconductor materials with a lattice constant different from that of the fin structure 11. Dislocations 12 in epitaxy region 13 provide a tensile strain or a compressive strain in epitaxy region 13 and to the portion 111 of fin structure 11. For the n-type FinFET, or an n-type metal-oxide-semiconductor (NMOS) device, adding SiC in epitaxy region 13 provides a tensile strain. For the p-type FinFET, or a p-type metal-oxide-semiconductor (PMOS) device, adding SiGe in epitaxy region 13 provides a compressive strain. In some embodiments, desired impurities are in epitaxy region 13.

A plurality of dislocations 12 is within the epitaxy region 13 and within the fin structure 11. Dislocation 12 extends continuously from the epitaxy region 13 to the fin structure 11 in the portion 111 and in between isolation regions 10. Dislocations 12 at one side of the gate structure 14 are nearly parallel with each other. For example, most of dislocations 12 include a lower portion slanting towards the gate structure 14 in a uniform fashion. In some embodiments, spacing between each dislocation 12 is about the same. Dislocation 12 includes a plane region, resulting from a lattice mismatch in the plane region. The plane region includes a lower edge L parallel to the second longitudinal axis, which is in direction Y. Dislocations 12 at both sides of the gate structure 14 are nearly symmetrical with respect to the gate structure 14.

Figure 2A:
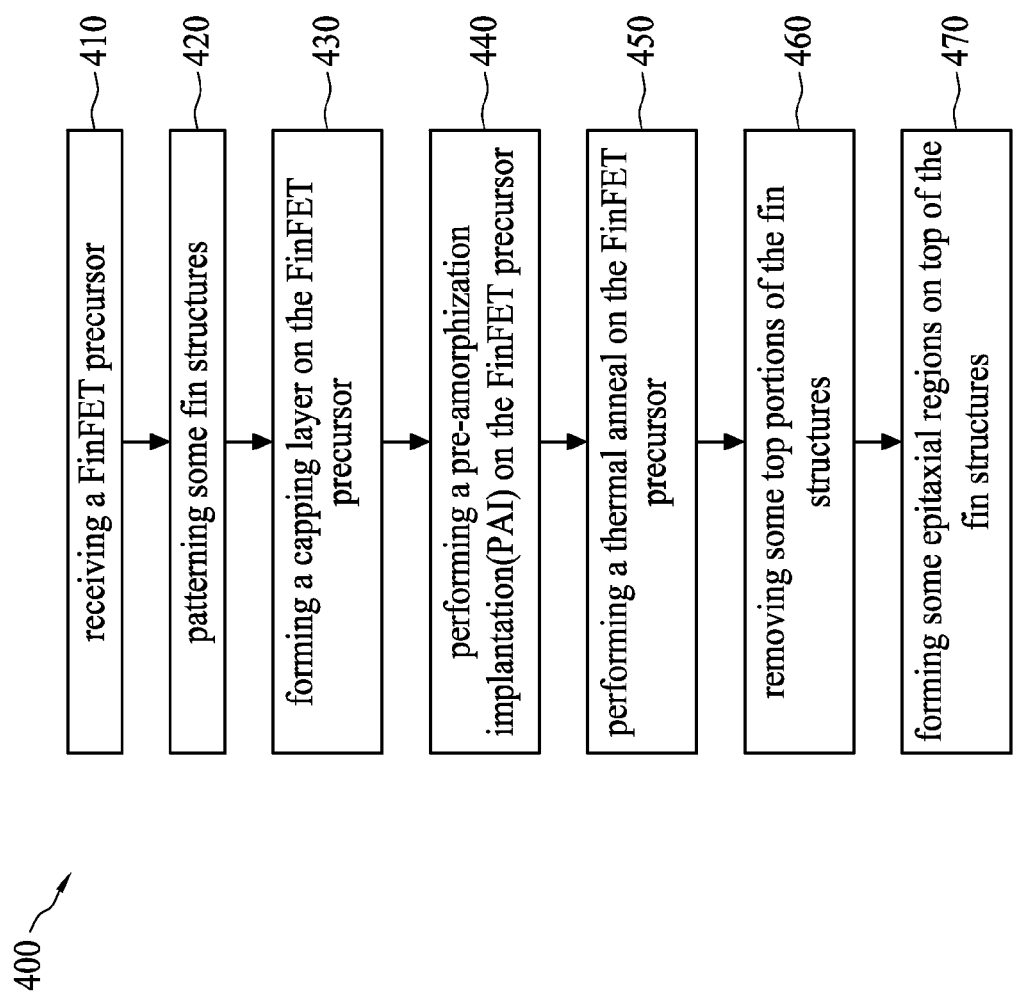
FIG. 2A is an operational flow of a method for manufacturing a semiconductor device, in accordance with some embodiments of the present disclosure.
Figure 7Y:
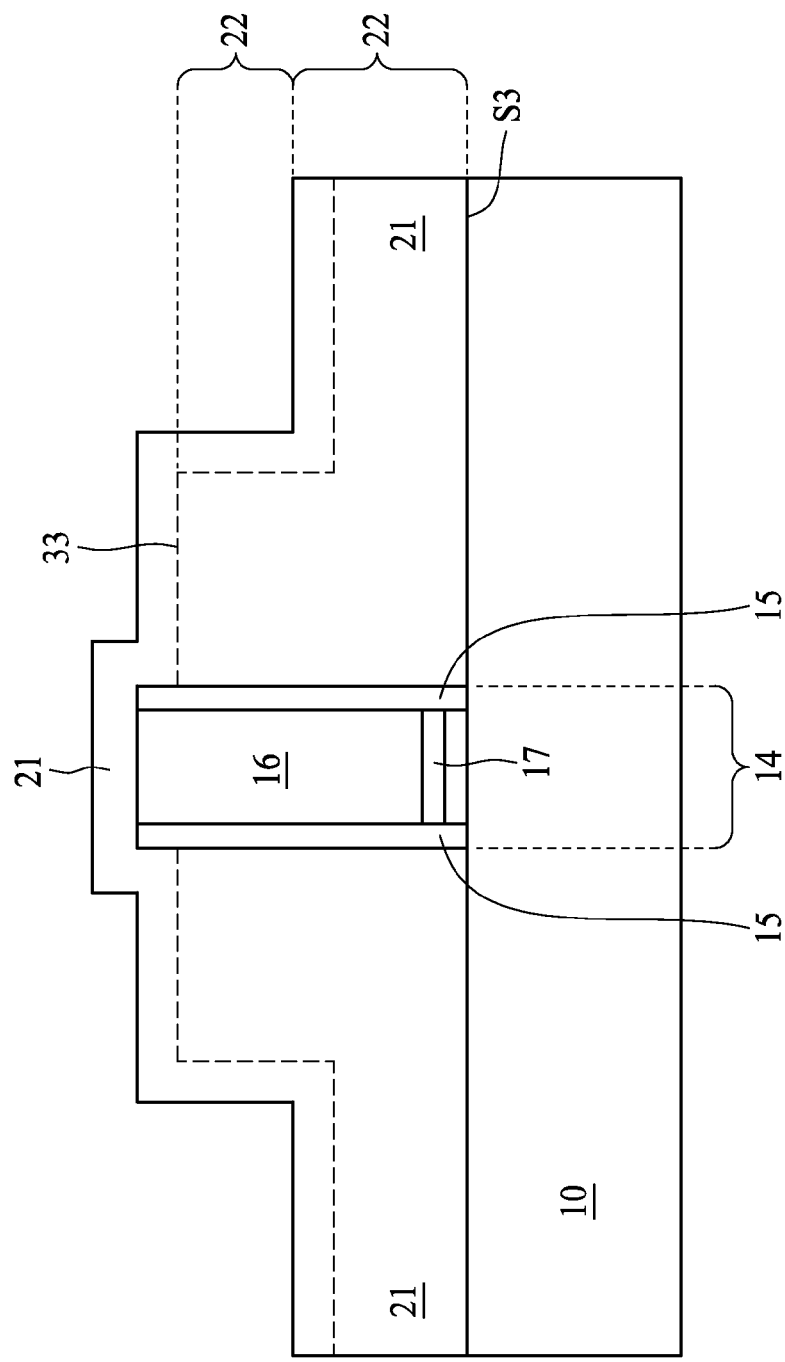
FIGS. 7X and 7Y are some cross-sectional views of an operation in a method for manufacturing a semiconductor device, in accordance with some embodiments.
Figure 7X:
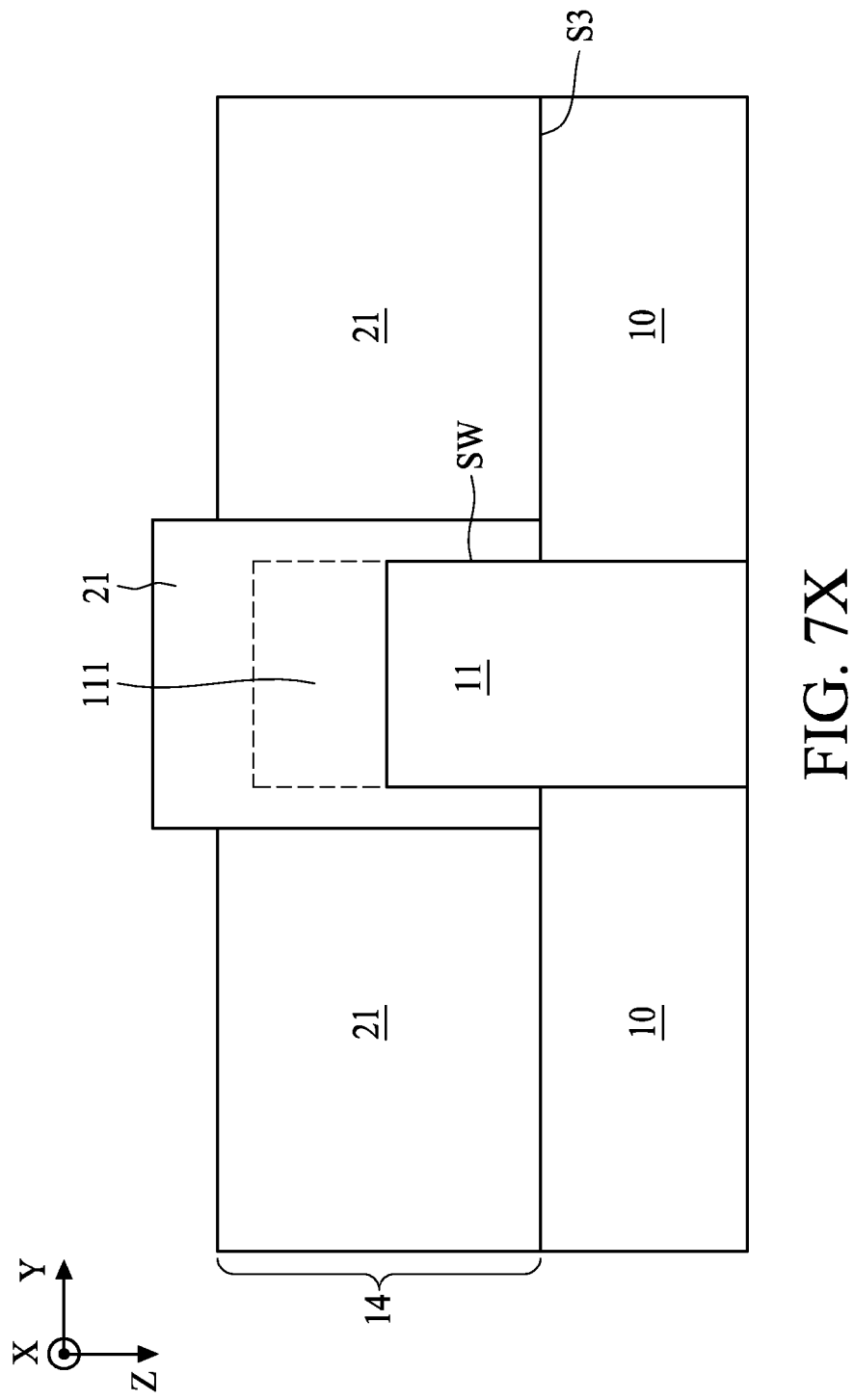

FIG. 2A illustrates a process flow for forming semiconductor device 200 in FIG. 1. Operation 410 receives a FinFET precursor 100. Some exemplary embodiments for operation 410 are illustrated in FIGS. 3, 3X, 3Y, 3Z. Operation 420 patterns some fin structure 11. Some exemplary embodiments for operation 420 are illustrated in FIGS. 4X, 4Y, 4Z, 5X, and 5Z. Operation 430 forms a capping layer 21 on the FinFET precursor 100. Some exemplary embodiments for operation 430 are illustrated in FIGS. 7X and 7Y. Operation 440 performs a pre-amorphization implantation (PAI) 31 on the FinFET precursor 100. Some exemplary embodiments for operation 440 are illustrated in FIGS. 8X and 8Y. Operation 450 performs a thermal anneal on the FinFET precursor 100. Operation 460 removes some top portions of the fin structures 11. Some exemplary embodiments for operation 460 are illustrated in FIGS. 10X, 10Y, 10Z, 11X, and 11Y. Operation 470 forms some epitaxy regions 13 on top of the fin structures 11. Some exemplary embodiments for operation 470 are illustrated in FIGS. 12X, 12Y, 12Z, and 12.

Figure 2B:
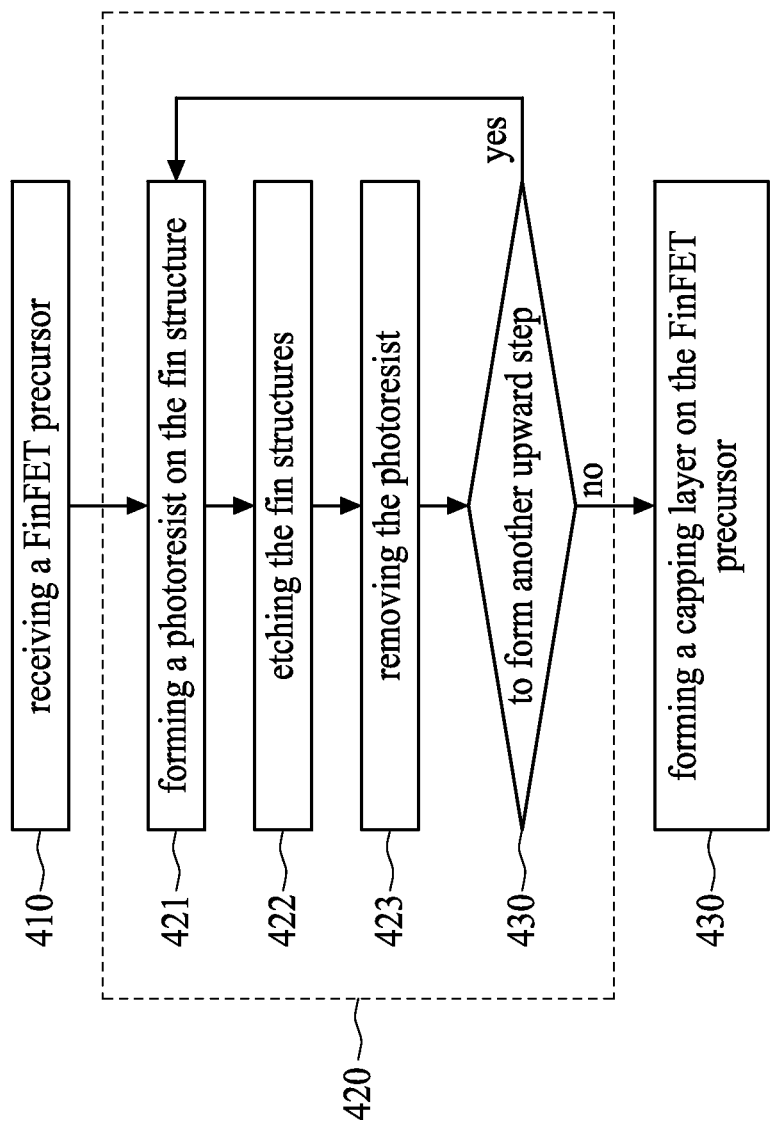
FIG. 2B is an operational flow of a method for manufacturing a semiconductor device, in accordance with some embodiments of the present disclosure.
Figure 4Y:
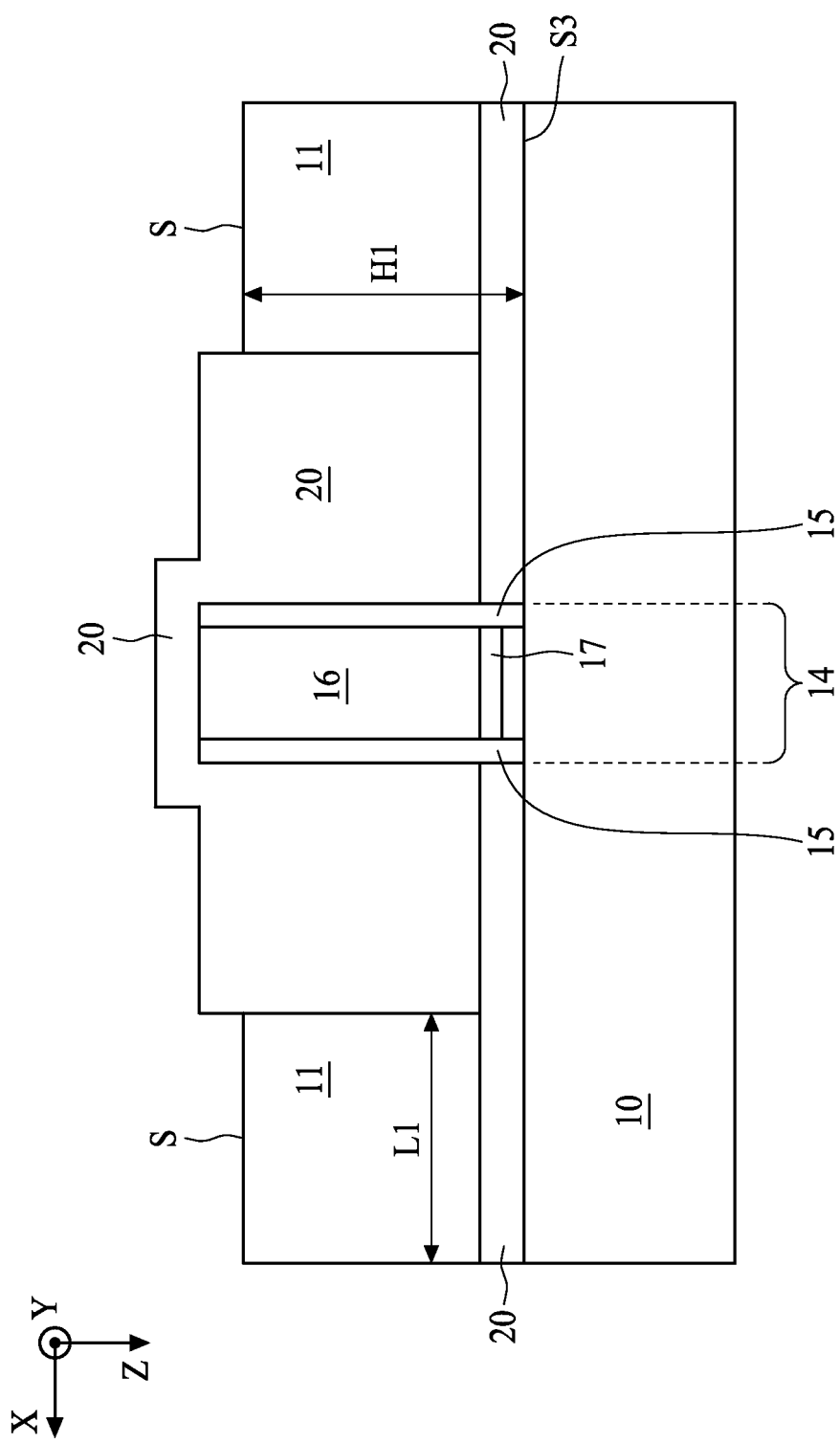
Figure 4Z:
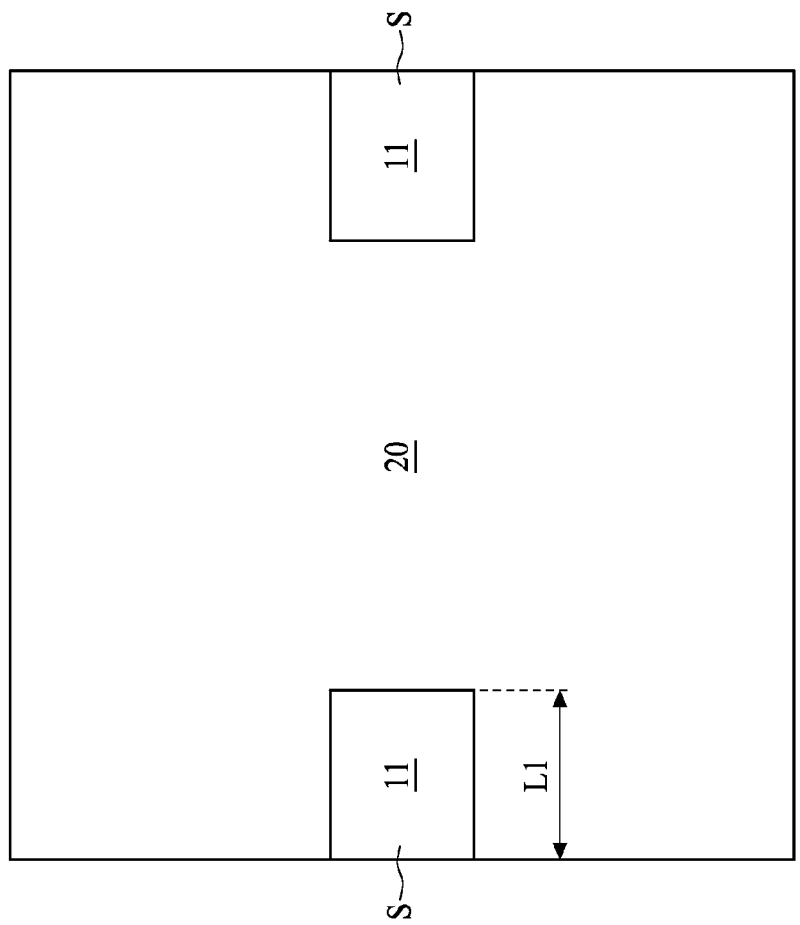

FIG. 2B illustrates a process flow for patterning fin structure 11 in operation 420. Operation 420 includes some sub operations such as operation 421, operation 422, operation 423, and operation 430. Operation 421 forms a photoresist 20 on the fin structure 11. Some exemplary embodiments for operation 421 are illustrated in FIGS. 4X, 4Y, and 4Z. Operation 422 etches the fin structure 11. Some exemplary embodiments for operation 422 are illustrated in 5X and 5Y. Operation 423 removes the photoresist 20. Some exemplary embodiments for operation 423 are illustrated in 6X and 6Y. Operation 430 determines whether to form another upward step 22. To form another upward step 22, operation 421 through operation 423 are repeated. To stop forming another upward step 22, operation 430 is followed to form a capping layer 21 on the FinFET precursor 100.

Referring to FIGS. 3, 3Y, 3X, and 3Z, FinFET precursor 100 is received. The respective operation is shown as operation 410 in FIG. 2A.

Figure 3Z:
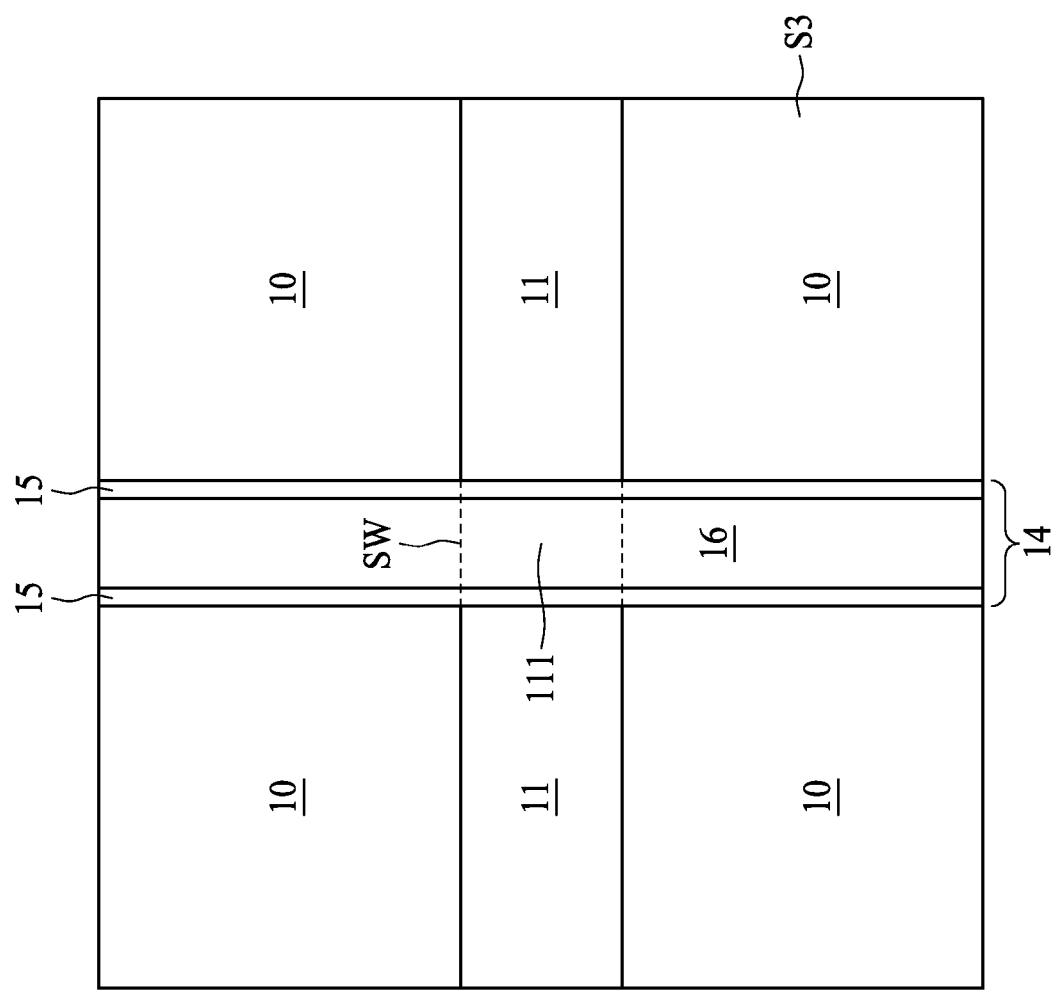

Fin structure 11 includes sidewall SW in contact with gate structure 14. Fin structure 11 is between isolation regions 10. A height H1 of a top portion of fin structure 11 is from a surface S3 of isolation region 10 to top surface TS of the top portion of fin structure 11. The top portion of fin structure 11 is a portion of fin structure 11 above surface S3. The height H1 is approximately the same for fin structure 11 on either side of gate structure 14 as well as for the portion 111. In FIG. 3Z, fin structure 11 is elongated to include a first longitudinal axis, which is in a same direction as direction X. Gate structure 14 is elongated to include a second longitudinal axis, which is in a same direction as direction Y. The first longitudinal axis is orthogonal to the second longitudinal axis. The portion 111 of fin structure 11 is at an intersection region of gate structure 14 and fin structure 11. The portion 111 includes sidewall SW in contact with gate spacer 15 and the gate stack.

Isolation region 10 is formed by any suitable process including a photolithography process, etching a trench in a substrate (not shown) by using a dry etching and/or wet etching, and filling the trench by using a chemical vapor deposition (CVD) with one or more dielectric materials. The trenches are filled to form fin structure 11 between isolation regions 10.

Referring to FIGS. 4Y, 4X, and 4Z, a photoresist 20 is formed on the fin structure 11. The respective operation is shown as operation 420 in FIG. 2A and operation 421 in FIG. 2B.

In FIG. 4Y, photoresist 20 is formed. Photoresist 20 is patterned by any suitable method in a lithography process. The lithography process can be a photolithography process includes forming a photoresist 20 overlying fin structure 11, isolation region 10, and gate structure 14, exposing photoresist 20 to a pattern, performing a post-exposure bake process, and developing the photoresist 20 to form a masking element including the photoresist 20. The pattern covers the top portion of fin structure 11 nearby gate structure 14.

In FIG. 4X and FIG. 4Z, some surfaces S are exposed and not covered by the masking element. The surfaces S are symmetric with respect to gate structure 14. The surface S includes a length L1 in direction X. In FIG. 4Y, Surface S is on the top portion of fin structure 11, a length L1 is shown to indicate a length of surface S.

Figure 5Y:
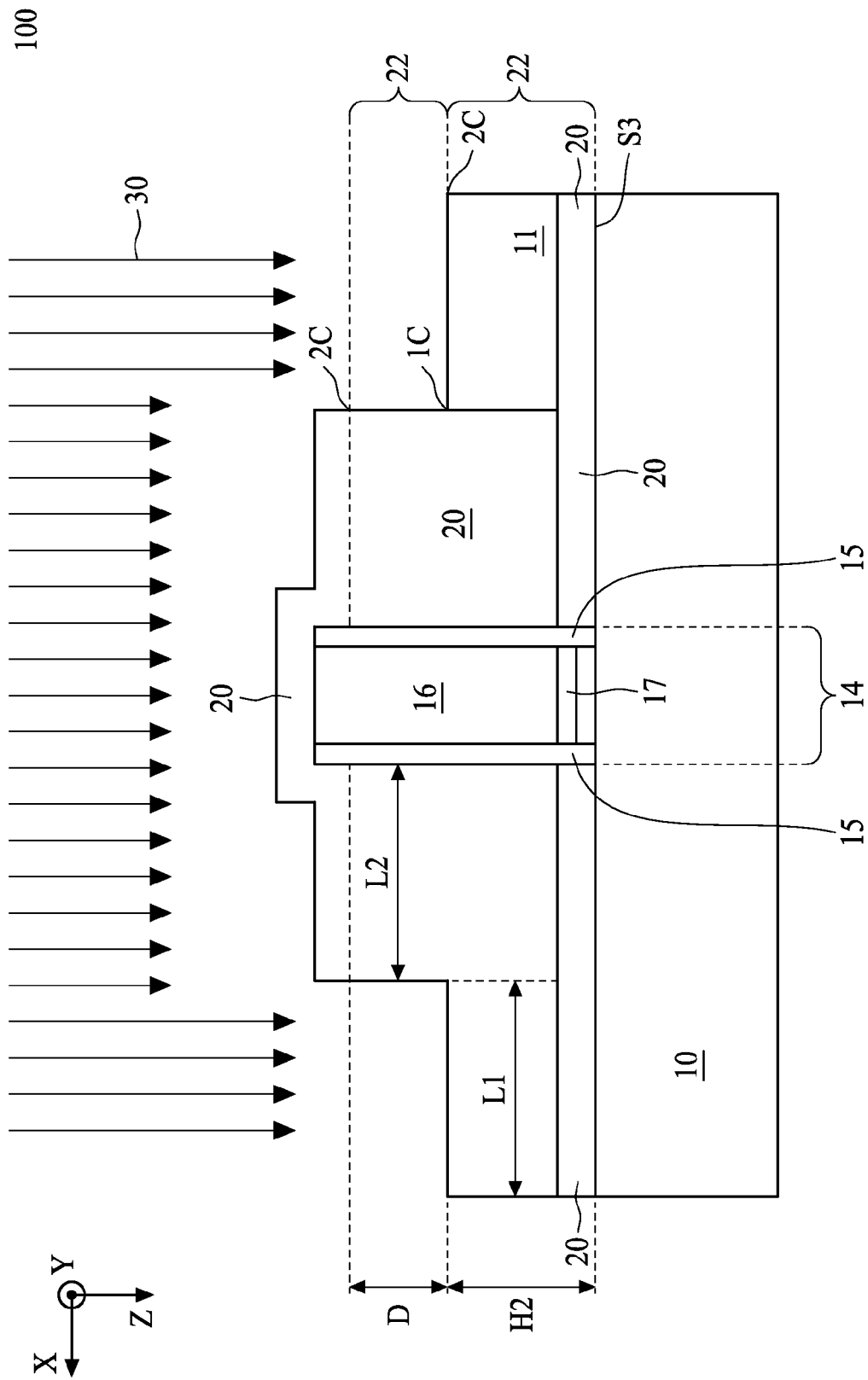
FIGS. 5Y and 5X are some cross-sectional views of an operation in a method for manufacturing a semiconductor device, in accordance with some embodiments.
Figure 5X:
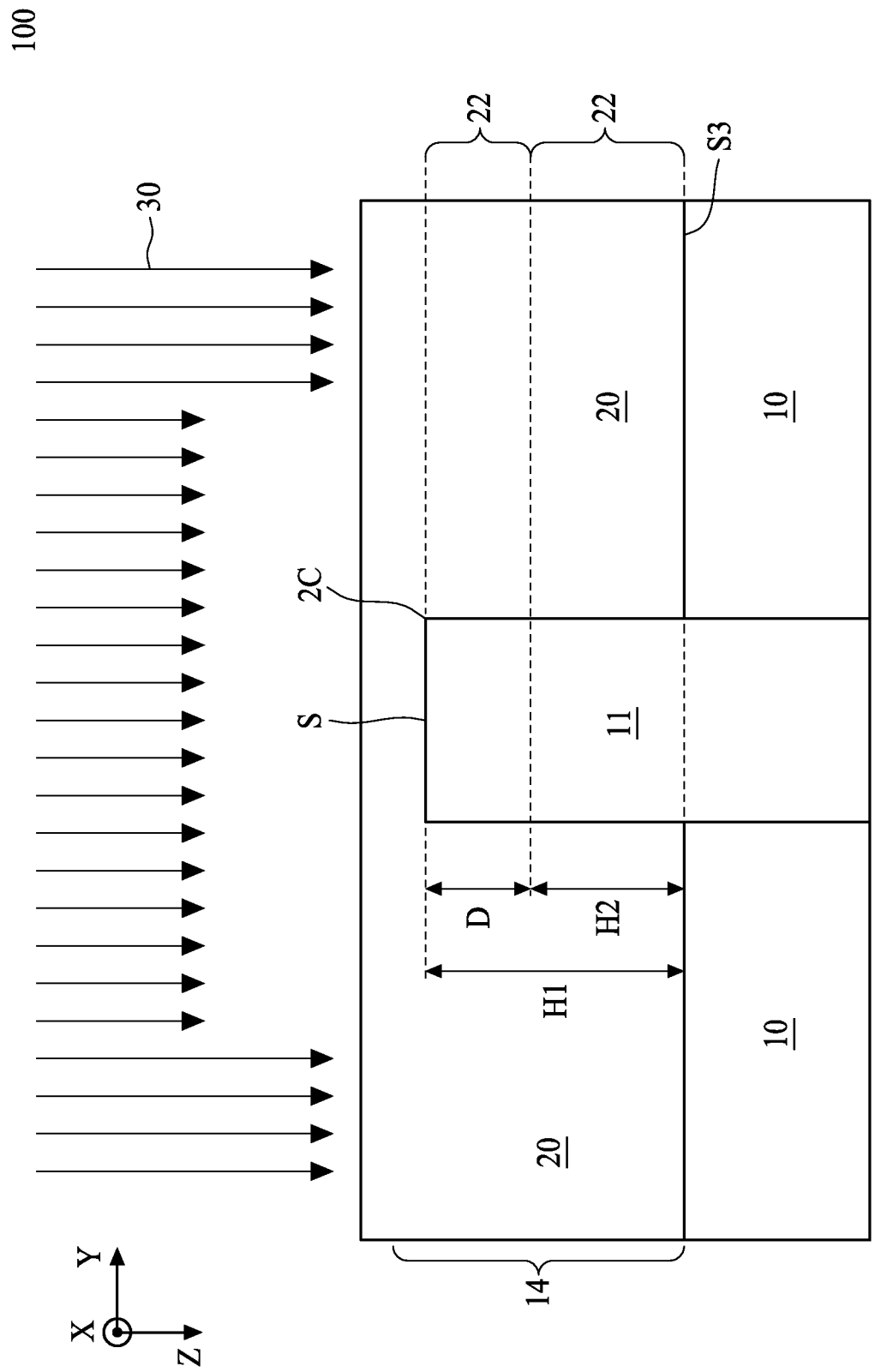

Referring to FIGS. 5X and 5Y, fin structure 11 is etched. The respective operation is shown as operation 420 in FIG. 2A and operation 421 in FIG. 2B.

Etching process 30 is performed on fin structure 11 along direction Z. The top portion of fin structure 11 not covered by photoresist 20 are recessed by etching process 30. The masking element is used to etch the fin structure 11 into a shape of upward steps 22 by recessing the top portion. A top edge of upward step 22 is illustrated using a dashed line since the top edge of upward step 22 is covered by photoresist 20. The top portion is etched using reactive ion etching (RIE) processes and/or other suitable processes. In an example, upward steps 22 are formed by patterning and etching a portion of the fin structure 11. Some portions of fin structure 11 are recessed by a distance D in direction Z to form an upward step 22. Height H1 minus height H2 equals to distance D. First corner 1C is distanced from gate spacer 15 by a length L2 horizontally in direction X. Length L2 is about a distance covered by a surface of photoresist 20 measured from gate spacer 15.

In some embodiments, etching process 30 is a selective etching. The selective etching can use some fluorine-containing gas, HBr and/or Cl2 as etch gases. In some embodiments, a bias voltage used in the etching process 30 can be adjusted to allow better control of an etching direction to be isotropic or anisotropic. In some embodiments, an etching process 30 can include selective etching with slower etching rate for material in photoresist 20 than for materials such as silicon in fin structure 11. In some embodiments, a recessing process can be performed by one or plurality of etching processes 30. Different etchant can be used for etching different compositions of materials.

Figure 6X:
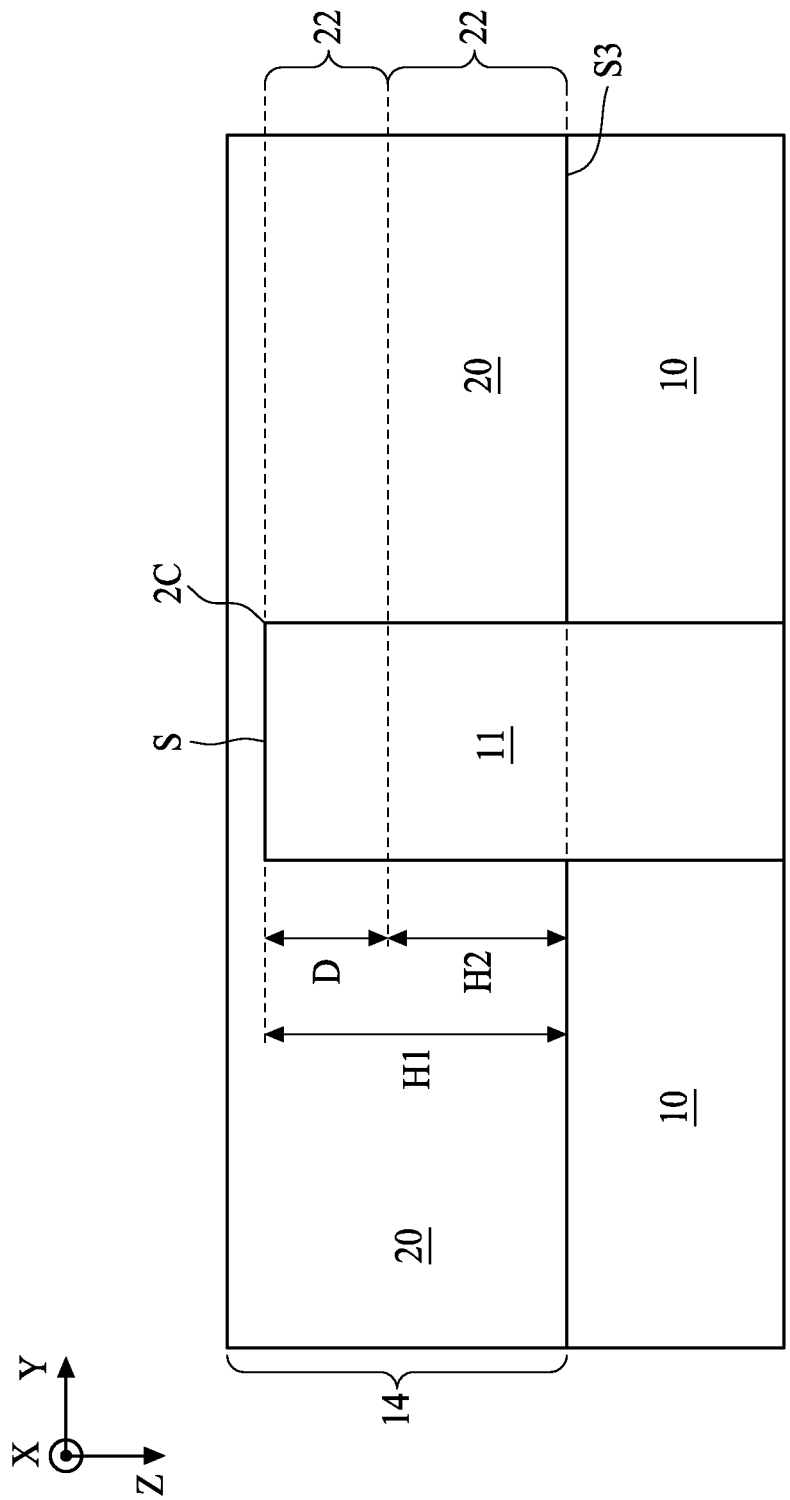

Referring to FIGS. 6X and 6Y, photoresist 20 is removed. The respective operation is shown as operation 420 in FIG. 2A and operation 423 in FIG. 2B. Photoresist 20 is removed by any suitable method such as etching, etch back, or planarization. Two upward steps 22 are formed. Upward step 22 closest to a top surface of gate structure 14 is a top step. Upward step 22 closest to isolation region 10 is a bottom step. Upward step 22 is raised from surface S3 of isolation region 10 by a level H2. The upward steps 22 are symmetrical on either side of gate structure 14. Upward step 22 includes a first corner 1C and a second corner 2C. A height of the upward step 22 is measured vertically from a first corner 1C to a second corner 2C. A length of the upward step 22 is measured horizontally from a first corner 1C to a second corner 2C.

In some embodiments, a plurality of upward steps 22 is formed between the top step and the bottom step with plurality of first corners 1C and second corners 2C. First corner 1C is concave inward. Second corner 2C is convex outward at nearly a right angle. The plurality of upward steps 22 is formed via operation 420 in FIG. 2B. Performing an iteration including operation 421, operation 422, operation 423, and operation 430 can form one upward step 22 on either side of gate structure 14. The bottom step is formed in a first iteration and the top step is formed in a last iteration. For each iteration, a photoresist 20 in operation 421 is formed smaller compare to a photoresist 20 formed in a previous iteration to make shorter length L2 for each upward step 22 formed consecutively. For each iteration, a distance D in operation 422 is etched shorter relative to a distance D etched in a previous iteration to form higher level H2 for each upward step 22 formed consecutively.

Alternatively, in some other embodiments, the lithography process is implemented or replaced by a maskless photolithography, electron-beam writing, and ion-beam writing. In another alternative, the lithography process could implement nanoimprint technology. For using the maskless photolithography, operation 421 and operation 423 are skipped in FIG. 2B.

As an alternative to traditional photolithography, upward steps 22 can be formed by a double-patterning lithography (DPL) process. DPL is a method of constructing a pattern on a substrate by dividing the pattern into two interleaved patterns. Various DPL methodologies include double exposure (e. g., using two mask sets), forming some spacers adjacent features and removing the features to provide a pattern of the spacers, photoresist 20 freezing, and/or other suitable processes. It is understood that upward steps 22 can be formed in a similar manner.

Referring to FIGS. 7X and 7Y, a capping layer 21 is formed on the FinFET precursor 100. The respective operation is shown as operation 430 in FIG. 2A.

Capping layer 21 is blanket covering to top of fin structure 11 and some portion of gate structure 14. Capping layer 21 is overlying comformally following a contour 33 of upward steps 22 on either side of gate structure 14. Contour 33 is illustrated using dashed line since upward step 22 is covered by capping layer 21. Capping layer 21 is grown from a sidewall SW and a top portion of fin structures 11. Some materials of capping layer 21 include silicon nitride, titanium nitride, oxynitride, oxide, SiGe, SiC, SiON, and/or combinations thereof. Capping layer 21 include an inherent tensile stress or compressive stress. For a FinFET precursor 100 to be a p-type FinFET, capping layer 21 includes an inherent compressive stress. Conversely, for a FinFET precursor 100 to be an n-type FinFET, capping layer 21 includes an inherent tensile stress. A formation process of capping layer 21 is adjusted to tune a stress to a desirable value. In some embodiments, capping layer 21 is a single layer. In other embodiments, capping layer 21 is a plurality of sub layers. Some formation methods include atomic layer deposition (ALD), chemical vapor deposition (CVD), or physical vapor deposition (PVD), or the like. The capping layer 21 including a silicon nitride is formed by a low pressure CVD (LPCVD). The capping layer 21 including a silicon nitride is formed by plasma enhanced CVD (PECVD). The capping layer 21 including a tetraethyl orthosilicate is formed by a CVD process. The capping layer 21 including a silicon oxide is formed by a high aspect ratio process (HARP).

Referring to FIGS. 8Y and 8X, a pre-amorphization implantation (PAI) 31 is performed on the FinFET precursor 100. The respective operation is shown as operation 440 in FIG. 2A. In some embodiments, the PAI 31 is performed using germanium, silicon, or the like. A dosage and a temperature of the PAI 31 process are controlled for various design purposes. In some embodiments, the PAI 31 is performed at a low implantation temperature or at room temperatures. The FinFET precursor 100 undergoes the PAI 31. The PAI 31 injects some doping species into fin structures 11 and disrupts a semiconductor lattice therein. By introducing some doping species such as Si, Ge, Ar, Xe, BF2, As, and/or In into fin structures 11, a molecular lattice of fin structure 11 is damaged. This creates an amorphous region (not shown) within the semiconductor material of capping layer 21 and fin structure 11. The amorphous region includes amorphous silicon, and some polysilicon grains. Portions 111 are illustrated using dash lines since they are behind capping layer 21 in FIGS. 7X and 8X. The portion 111 of fin structure 11 under gate structure 14 is protected from the PAI 31, and remains to have a crystalline structure. In some embodiments, fin structure 11 undergoes multiple implantations utilizing a variety of energies, doping species, angles and dosages. In some embodiments, a patterned photoresist layer (not shown) is used to define the amorphous region and to protect other regions of the FinFET precursor 100 from implantation damage. For example, the patterned photoresist layer exposes the fin structures 11 to the PAI 31 while gate structure 14 is protected from the PAI 31. In some embodiments, a patterned hard mask layer, such as a SiN or SiON layer is used to define the amorphous region.

In some embodiments, operation 440 is skipped such that a thermal anneal is performed on the FinFET precursor 100 after a formation of capping layer 21. In FIG. 2A the operation 450 performs the thermal anneal on the FinFET precursor 100. The thermal anneal is performed to form defects in the amorphized regions. The thermal anneal is performed using a Rapid Thermal Anneal (RTA), laser anneal, or other anneal methods. In some embodiment, the thermal anneal is performed using a spike RTA. The thermal anneal can include a long range pre-heat.

As a result of the thermal anneal, fin structure 11 is recrystallized with a memorized stress obtained from capping layer 21. The capping layer 21 is removed by any suitable process including a wet etching or a dry etching process. In one example, capping layer 21 composed of a silicon nitride is removed by an etching operation involving phosphoric acid. In another example, capping layer 21 composed of a silicon oxide is removed by an etching operation involving a hydrofluoric acid (HP) or a buffered HF. In another example, capping layer 21 is removed by a Chemical-Mechanical Planarization (CMP) process. The capping layer 21 is removed, yet fin structures 11 retain a stress effect. Retaining the stress effect is through operation 430, 440, and 450, and is referred to as a stress-memorization technique (SMT).

Referring to FIGS. 9, 9Y and 9X, dislocations 12 are formed. Dislocation 12 is formed proximate to first corner 1C and second corner 2C. Dislocations 12 are formed at either side of gate structure 14 such that the dislocations 12 are nearly symmetric on either side of the gate structure 14. At one side of the gate structure 14, dislocations 12 are nearly parallel. The lower portions of dislocations 12 are slanting towards the gate structure 14 in a uniform fashion. Dislocation 12 includes a plane region, resulting from a lattice mismatch near the plane region. Some re-crystallized region contains some irregularities near dislocation 12. For example, a locally uniform region above the plane region is misaligning with other regions below the plane region. This form of misalignment results in dislocations 12. The plane region includes a lower edge L parallel to direction Y. The lower portion of dislocation 12 and the lower edge L are in a lower portion of fin structure 11. A total number of dislocations 12 in FinFET precursor 100 is approximately a total number of first corners 1C plus a total number of second corners 2C. A plurality of dislocations 12 is within fin structure 11. Dislocation 12 extends continuously from first corner 1C and second corner 2C to the portion 111 and in between isolation regions 10. In some embodiments, at one side of gate structure 14, spacing between each dislocation 12 is about the same. In FIG. 9X, dislocation 12 includes a plane region. FIG. 9 illustrates a diagrammatic perspective view of a FinFET precursor 100 with two upward steps 22 and some dislocations 12 formed therein.

Figure 10Y:
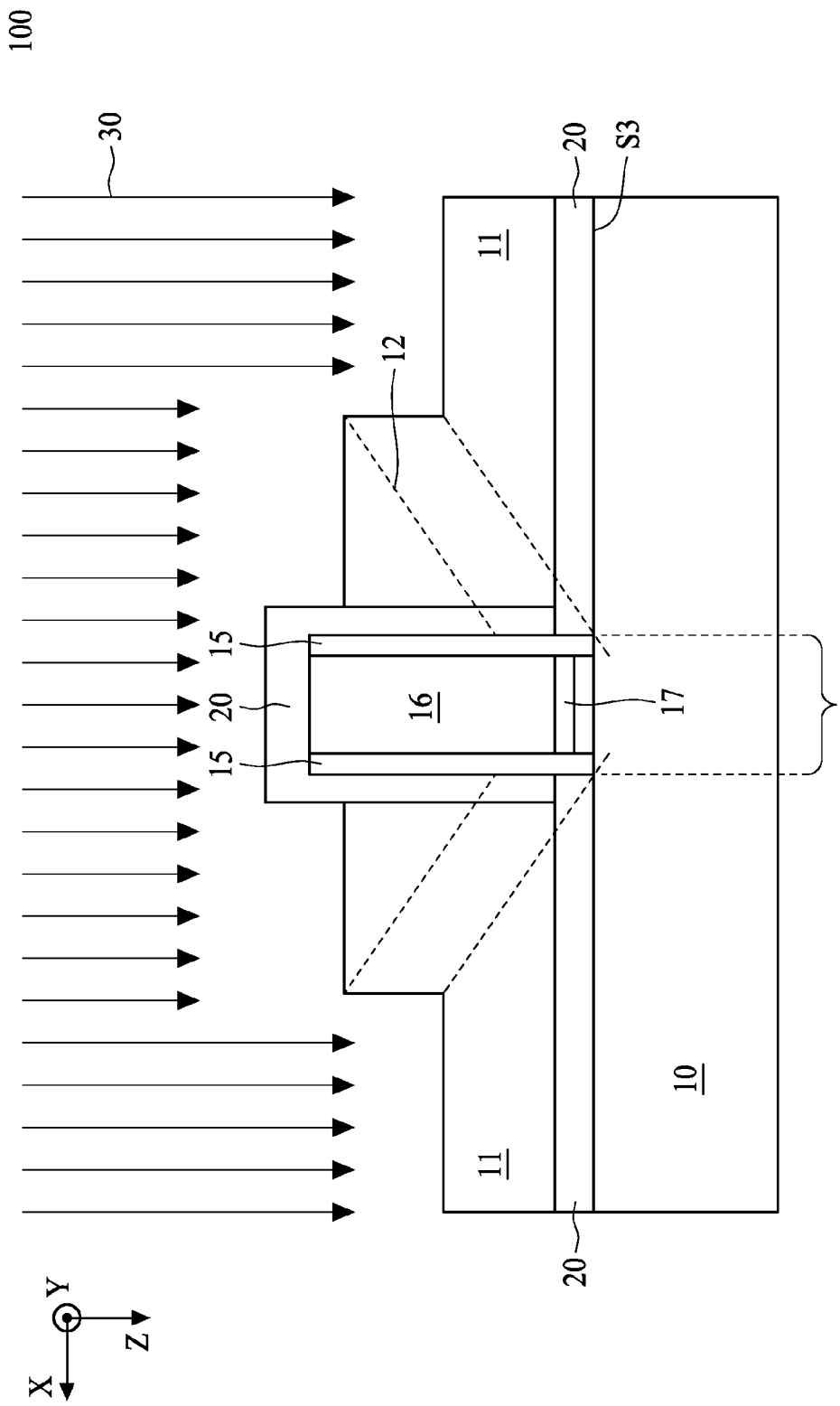
FIGS. 10X, 10Y and 10Z are some cross-sectional views and a top view of an operation in a method for manufacturing a semiconductor device, in accordance with some embodiments.
Figure 10X:
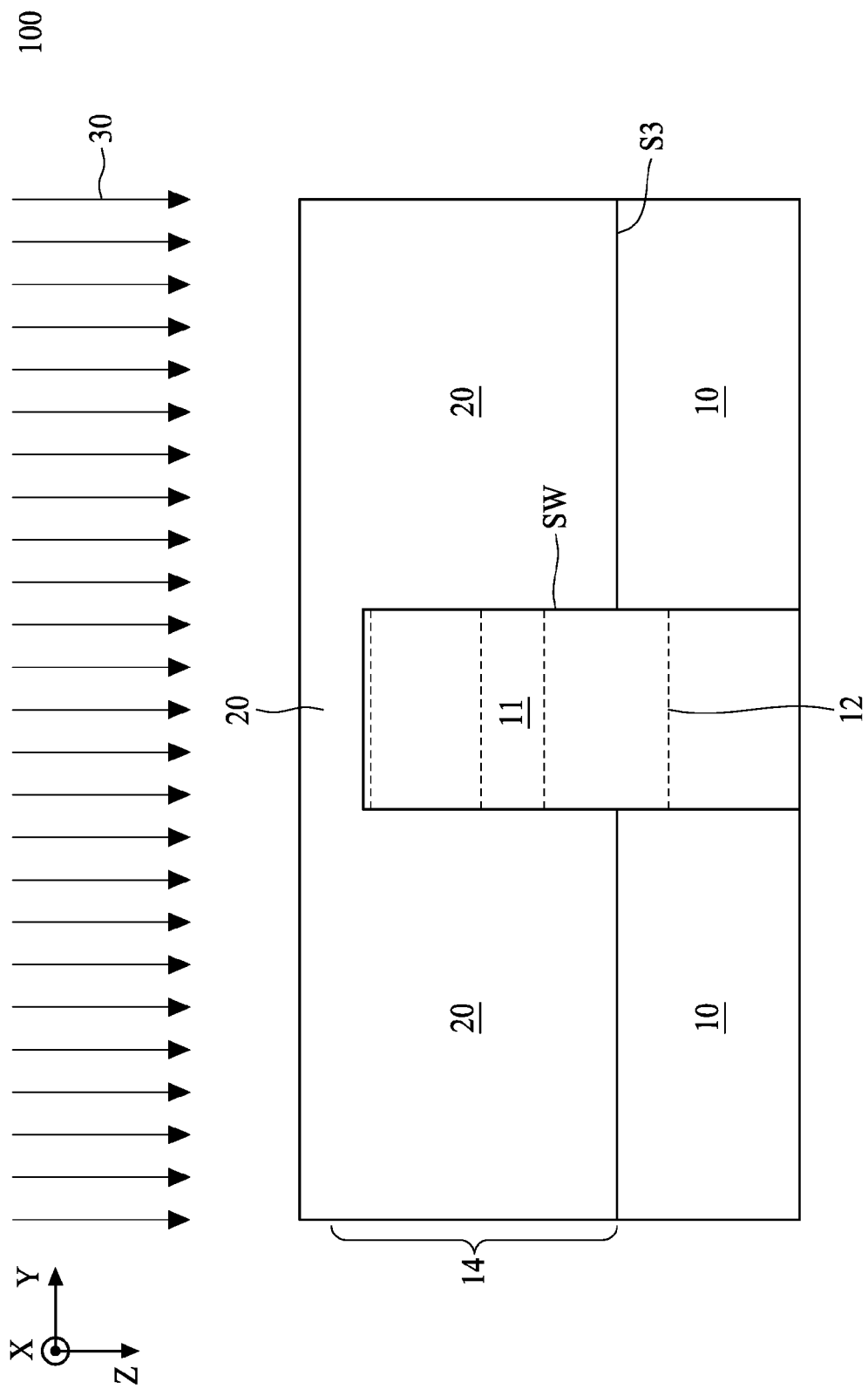
Figure 10Z:
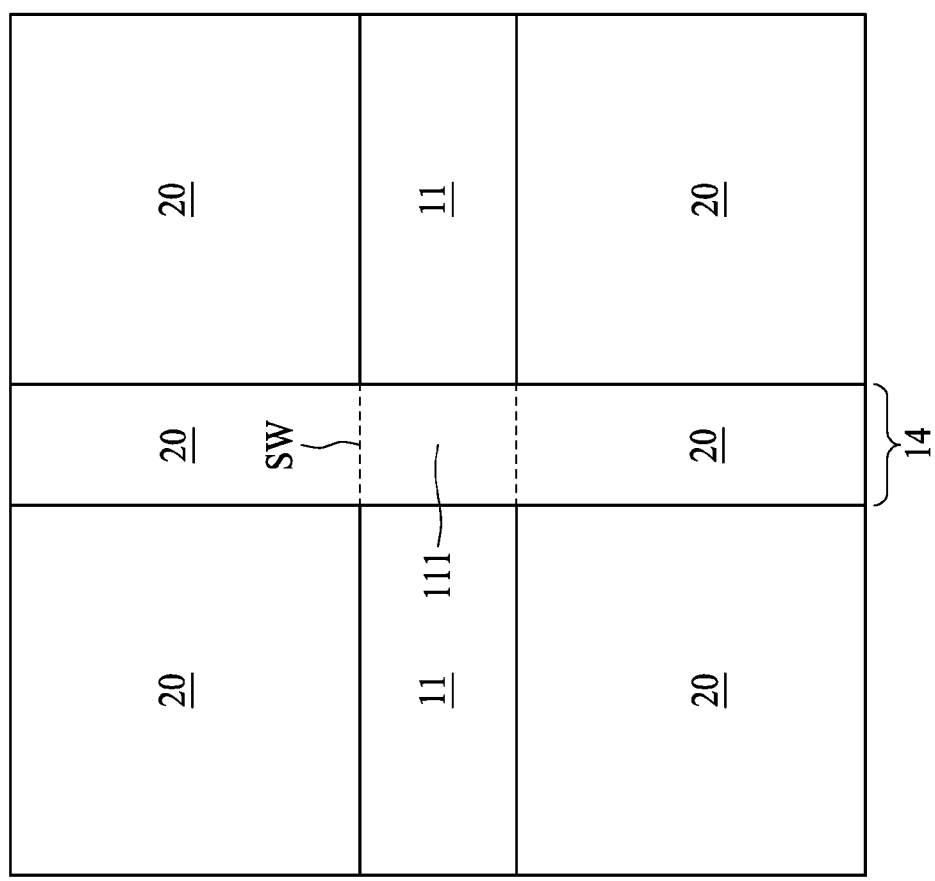

Referring to FIGS. 10Y, 10X, and 10Z, some top portions of the fin structures 11 are removed. The respective operation is shown as operation 460 in FIG. 2A.

A photoresist 20 is covered on top of gate structure 14. Etching process 30 recesses the top portions of the fin structure 11. The portion 111 of fin structure 11 is remained and protected by gate structure 14. Removing the top portions of the fin structure 11 by a lithography process including forming a photoresist 20 over the FinFET precursor 100, patterning the photoresist 20 to have some openings that expose the fin structure 11 at either side of gate structure 14, and etching the fin structure 11. Forming the photoresist 20 involves photoresist coating (e.g., spin-on coating), soft baking, mask aligning. Patterning the photoresist 20 involves exposure, post-exposure baking, developing a photoresist layer, rinsing, drying (e.g., hard baking), other suitable processes, or combinations thereof.

The etching process 30 is a dry etching process. The dry etching process can be implemented in an etching chamber. The dry etching process can implement an oxygen-containing gas, fluorine-containing gas (e.g., CF4, SF6, CH2F2, CHF3, and/or C2F6), chlorine-containing gas (e.g., Cl2, CHCl3, CCl4, and/or BCl3), bromine-containing gas (e.g., HBr, He and/or CHBR3), iodine-containing gas, other suitable gases and/or plasmas, and/or combinations thereof. In some embodiments, the dry etching process utilizes an O2 plasma treatment and/or an O2/N2 plasma treatment. Further, the dry etching process can be performed for a suitable duration. Some process parameters such as etching durations and/or etch rate are adjustable to control how much material is removed from fin structure 11.

Alternatively, in some other embodiments, the etching process 30 is a wet etching process, or a combination of a dry and wet etching process. Some process parameters such as a concentration of some acid bath, a temperature of a chemical bath, an agitation of a solution bath, and/or the etching duration are adjustable to control how much the top portion is removed from fin structure 11.

Alternatively, the lithography process is implemented or replaced by other methods, such as maskless photolithography, electron-beam writing, and ion-beam writing. In another alternative, the lithography process could implement nanoimprint technology.

Referring to FIGS. 11Y and 11X, some remaining portions of fin structure 11 is left. A remaining portion of fin structure 11 has a surface S2. The surface S2 of the remaining portions is higher than a surface S3 of the isolation region 10. With the top portion of fin structure 11 removed, the portion 111 is exposed in FIG. 11X. The dry etching process can be a physical etch for an anisotropic etch to obtain the portion 111 with substantially vertical sides facing direction X.

A lower portion of the plurality of dislocations 12 is within the remaining portion of fin structure 11. Dislocation 12 is left in the fin structure 11 in the portion 111 and in between isolation regions 10. Dislocation 12 is shortened by the etching process 30 in FIG. 10X. Level of surface S2 is determined by some process parameters in etching process 30. Surface S2 can be above a surface S3 of isolation region 10, at a same level with surface S3, or below surface S3. Surface S2 and surface S3 are substantially flat.

Referring to FIGS. 12, 12Y, 12X, and 12Z, some epitaxy regions 13 are formed on surface S2, on top of the remaining portion of fin structures 11. The respective operation is shown as operation 470 in FIG. 2A.

Epitaxy region 13 is formed by one or more epitaxy or epitaxial (epi) processes, such that Si features, SiGe features, and/or other suitable features are formed in a crystalline state on the remaining portion of fin structures 11. The epitaxy processes include CVD deposition techniques (e.g., vapor-phase epitaxy (V PE), ultra-high vacuum CVD (UHV-CVD)), molecular beam epitaxy, and/or other suitable processes. The epitaxy process uses gaseous and/or liquid precursors, which interact with a composition of fin structure 11. Thus, dislocation 12 is growing from the portion 111 into epitaxy region 13. In some embodiments, epitaxy region 13 is in-situ doped. Some doping species include p-type dopants, such as boron or BF2; n-type dopants, such as phosphorus or arsenic; and/or other suitable dopants including combinations thereof. In some embodiments, epitaxy region 13 is not in-situ doped. Dislocation 12 caused by the stress-memory technique SMT propagates to epitaxy region 13. Epitaxy region 13 possesses the stress effects caused by dislocations 12.

Figure 12X:
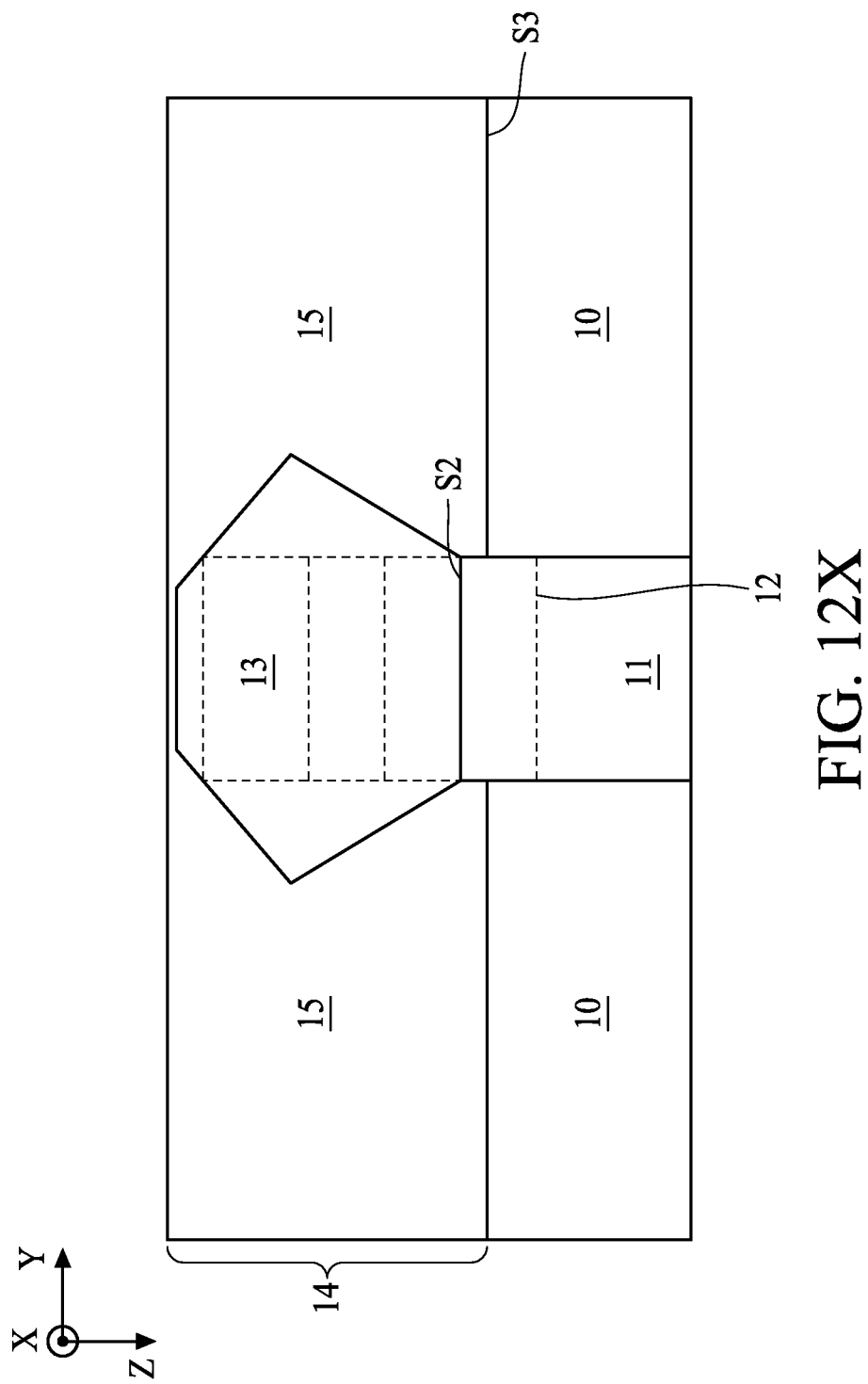
Figure 12Z:
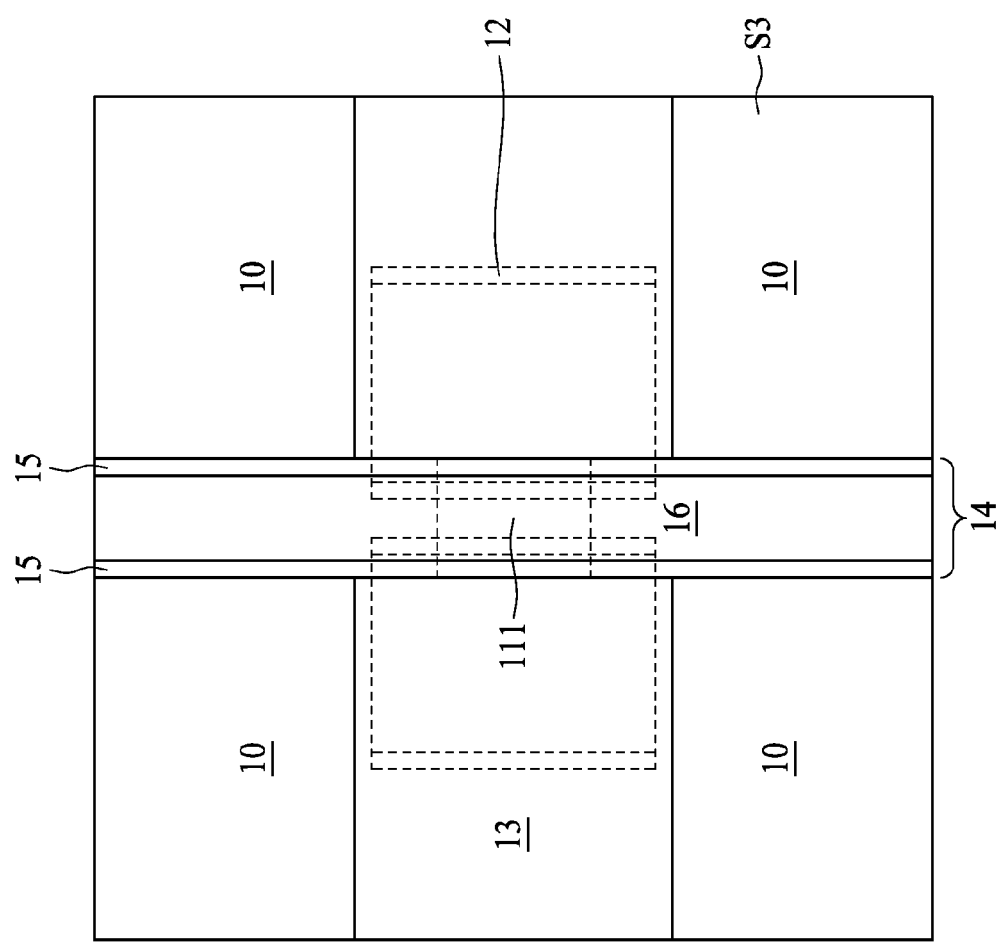

A plurality of dislocations 12 is within the epitaxy region 13 and within the fin structure 11. Dislocation 12 from the remaining portion of fin structure 11 and in the portion 111 forms continuously to the epitaxy region 13 as epitaxy region 13 grows on top of the fin structure 11. In FIG. 12X, epitaxy region 13 grows to form a surface in a polygonal shape. A plane covered by dislocation 12 is within the surface.

FIG. 12 is a diagrammatic perspective view of a FinFET precursor 100 including epitaxy region 13 containing dislocations 12.

Figure 13:
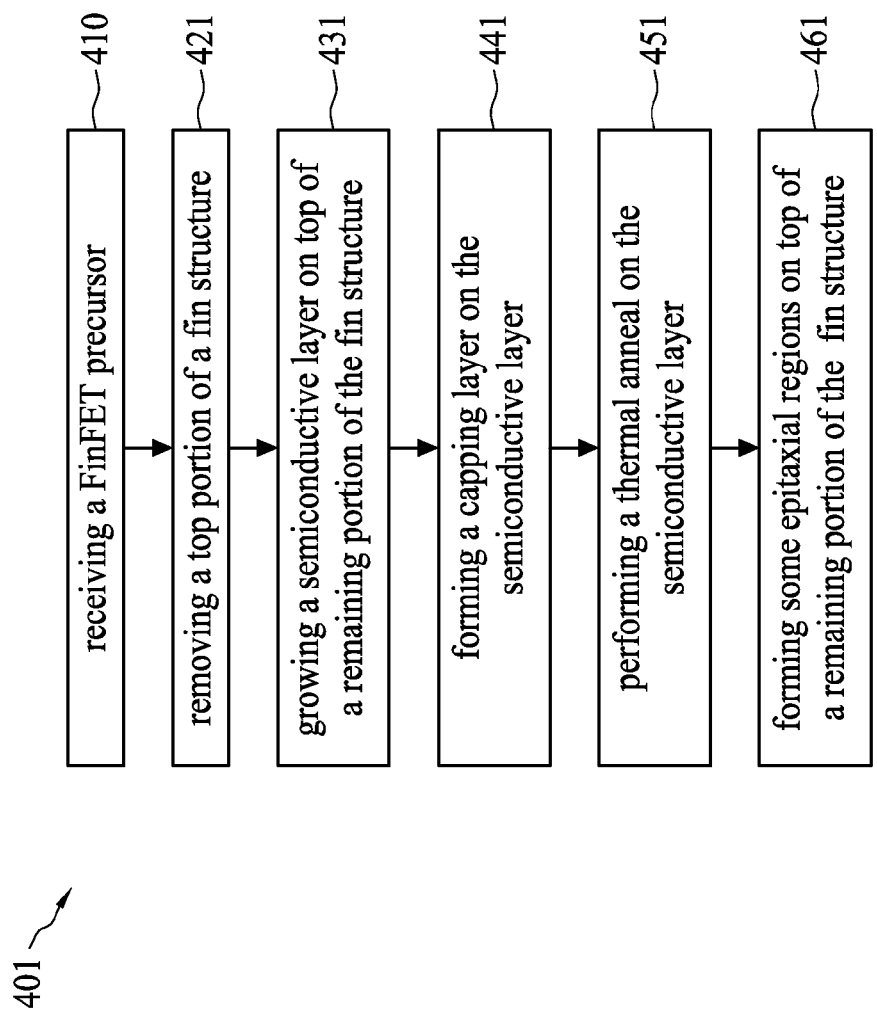
FIG. 13 is an operational flow of a method for manufacturing a semiconductor device, in accordance with some embodiments of the present disclosure.

FIG. 13 illustrates a process flow for forming semiconductor device 200 from FinFET precursor 100. Operation 410 receives a FinFET precursor 100. Operation 421 removes a top portion of a fin structure 11. Operation 431 grows a semiconductive layer 19 on top of a remaining portion of the fin structure 11. Operation 441 forming a capping layer 21 on the semiconductive layer 19. Operation 451 performs a thermal anneal on the semiconductive layer 19. Operation 461 forms some epitaxy regions 13 on top of a remaining portion of the fin structure 11.

Figure 14Y:
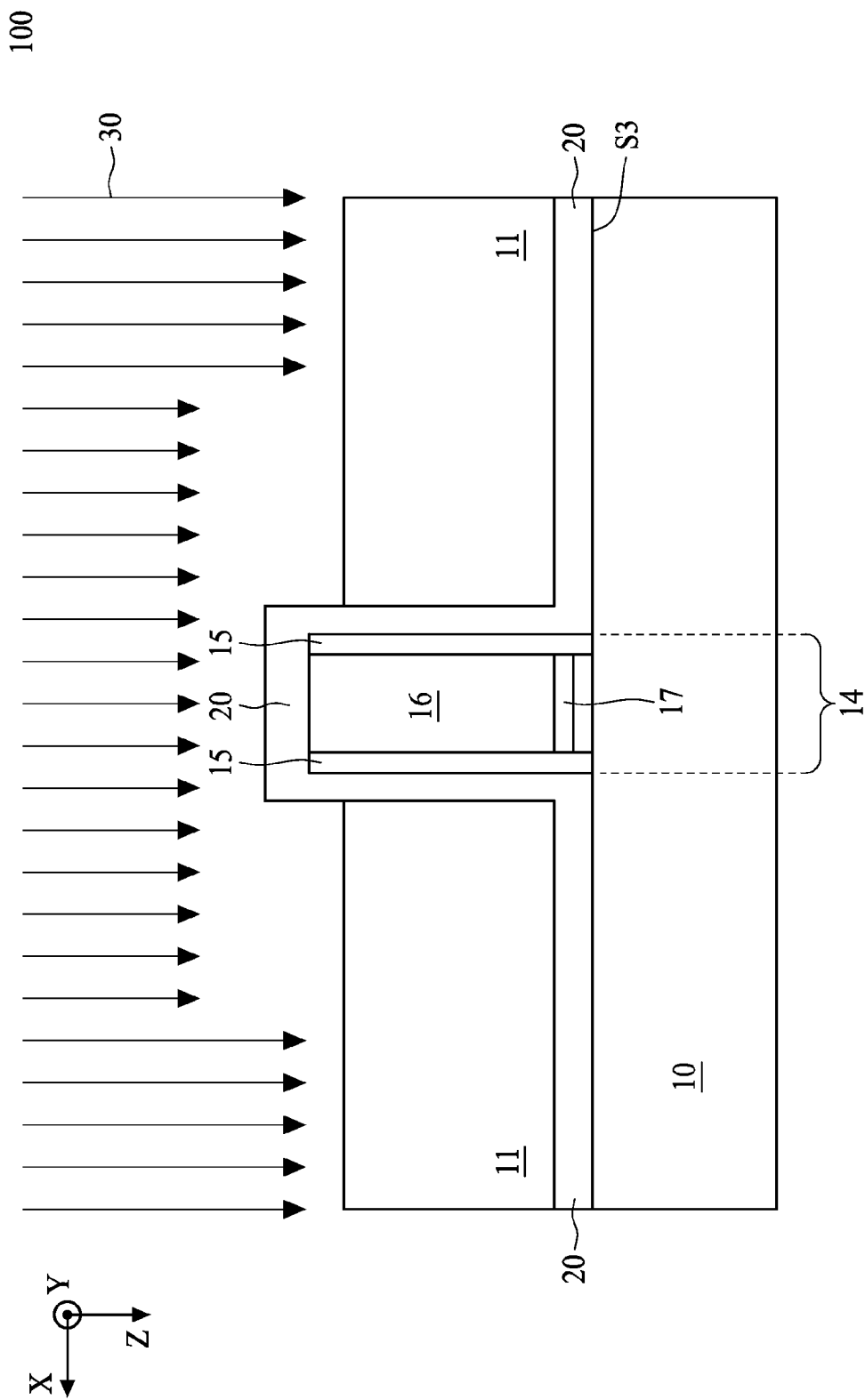
FIG. 14Y is a cross-sectional view of an operation in a method for manufacturing a semiconductor device, in accordance with some embodiments.

Referring to FIG. 14Y, removing a top portion of a fin structure 11 is performed. The respective operation is shown as operation 421 in FIG. 13.

Removing the top portion is performed by any suitable process such as etching process 30. Photoresist 20 is covering gate structure 14 with fin structure 11 exposed to etching. In one example, a layer of photoresist 20 is formed over gate structure 14 by a suitable process, such as spin-on coating, and patterned to form a photoresist feature by a proper photolithography patterning method. A pattern on the photoresist 20 can then be transferred by an etching process 30 to underlying fin structure 11.

Figure 15X:
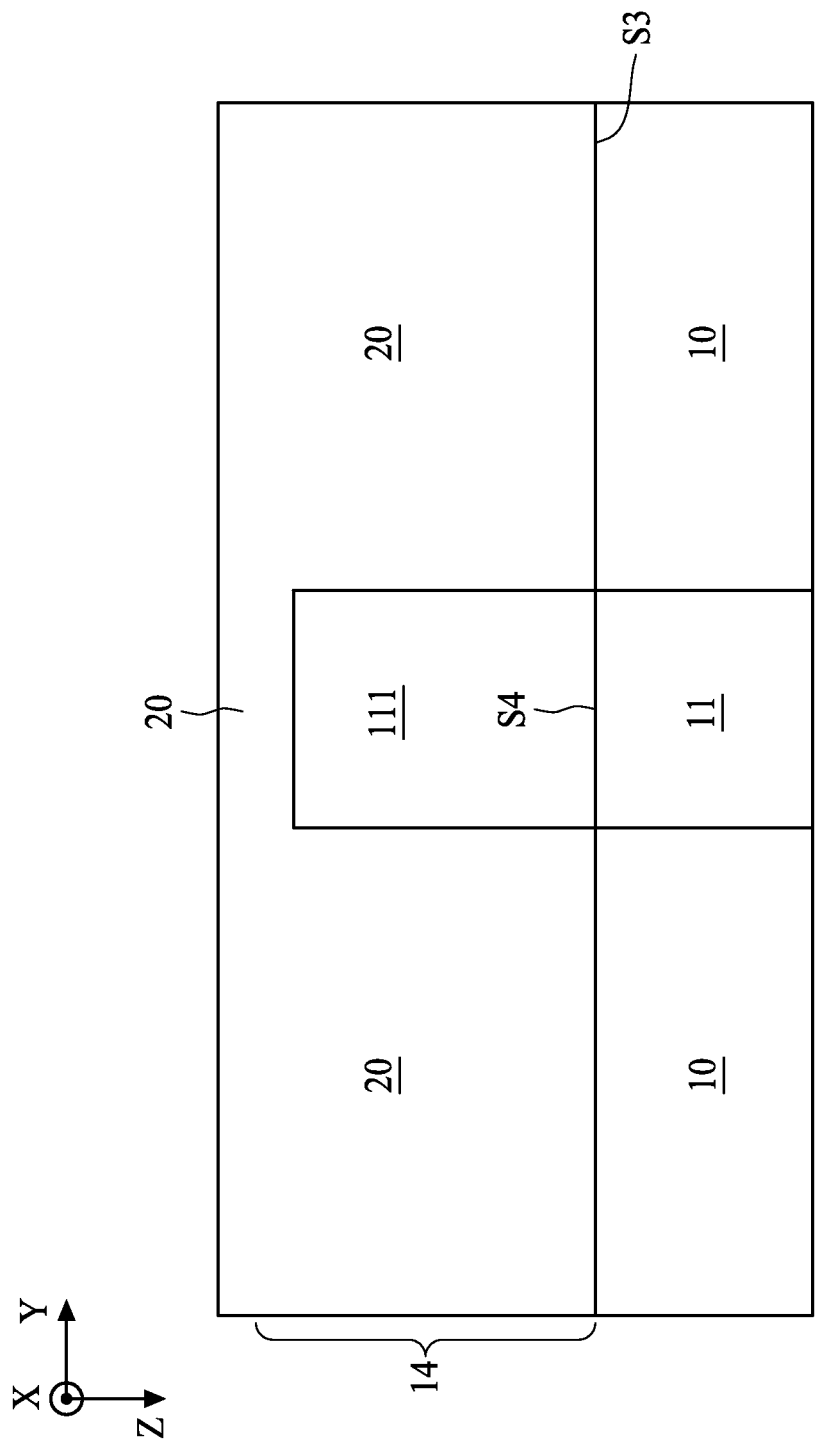

Referring to FIGS. 15Y and 15X, the top portion of a fin structure 11 is removed. The photoresist 20 is stripped thereafter. A remaining portion of fin structure 11 includes a lower portion between isolation region 10 and the portion 111 of fin structure 11. The lower portion includes a surface S4 at a top. Surface S4 can be above surface S3 of isolation 10, at a same level with surface S3, or below surface S3.

Figure 16Y:
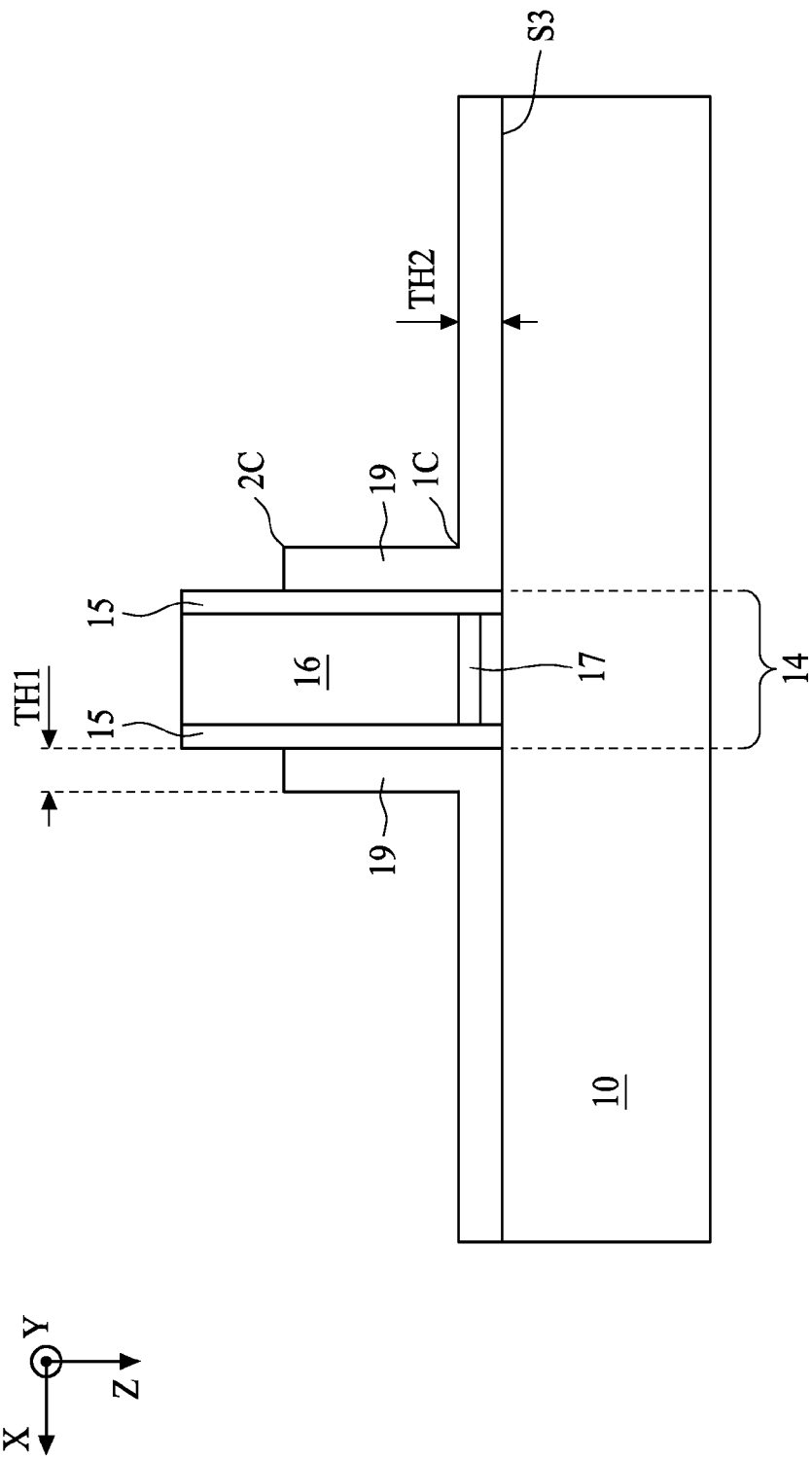
FIGS. 16X and 16Y are some cross-sectional views of an operation in a method for manufacturing a semiconductor device, in accordance with some embodiments.
Figure 16X:
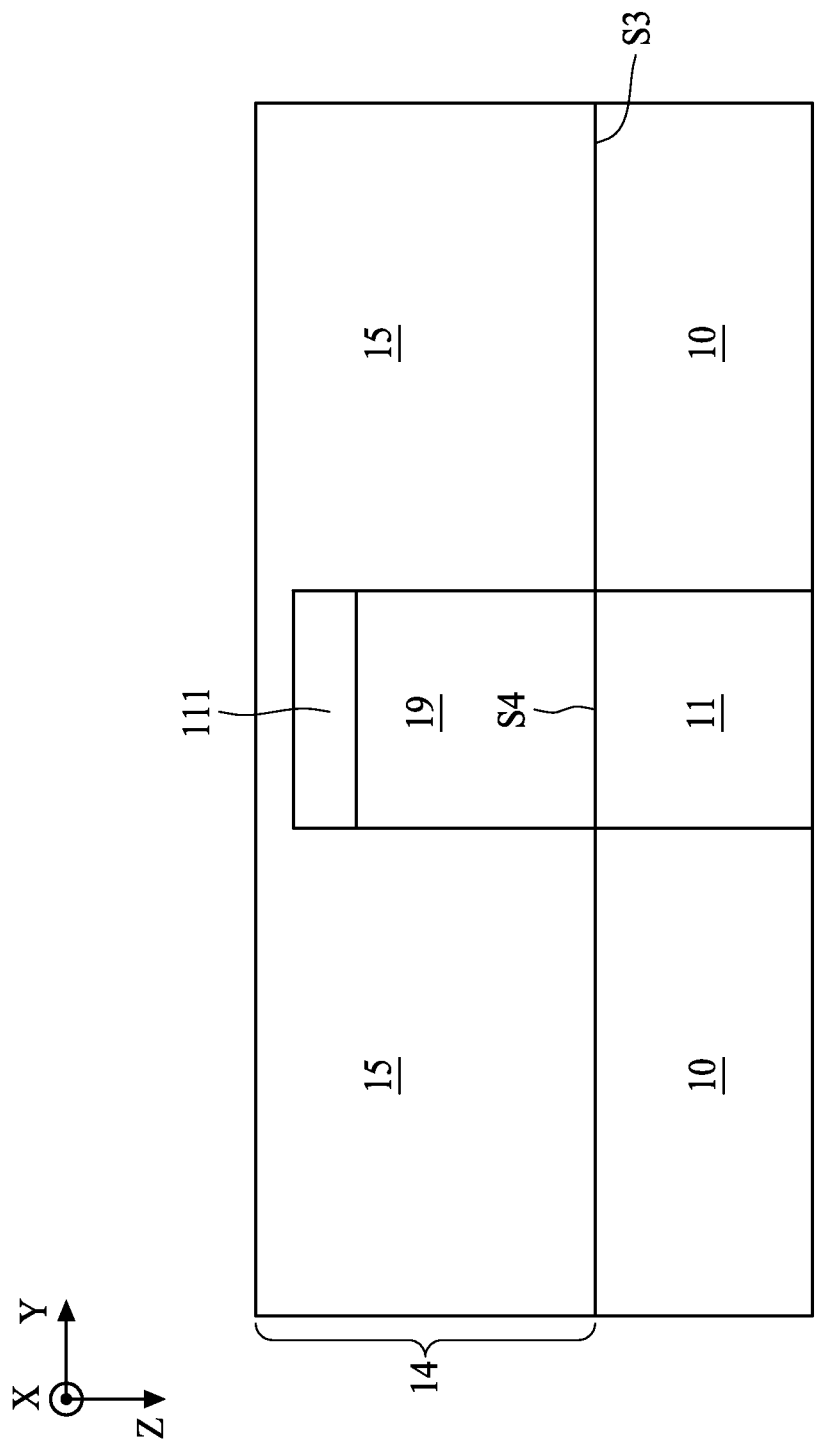

Referring to FIGS. 16Y and 16X, growing a semiconductive layer 19 on top of surface S4 on the fin structure 11 is performed. The respective operation is shown as operation 431 in FIG. 13.

Semiconductive layer 19 is overlying on top of the remaining portion of fin structure 11 to form a horizontal portion of semiconductive layer 19 with a thickness TH2. A portion of a layer of semiconductive layer 19 is lining to the portion 111 to form a vertical portion of semiconductive layer 19 with a thickness TH1. A plurality of corners is formed along the horizontal portion and vertical portion of semiconductive layer 19 over fin structure 11. A first corner 1C is located at a junction of the horizontal portion and the vertical portion of semiconductive layer 19. A second corner 2C is located proximate to a top of the vertical portion of semiconductive layer 19. The vertical portion of semiconductive layer 19 is lower than portion 111 as illustrated in 16X.

Growing semiconductive layer 19 is by any suitable method such as some epitaxial growth. Some epitaxial growth including some processes such as vapor-phase epitaxy (VPE), ultra-high vacuum chemical vapor deposition (UHV-CVD), Liquid Phase Epitaxy (LPE), and/or molecular-beam epitaxy (MBE). Some gas sources for some epitaxy reaction are a hydrogen reduction of silicon tetrachloride, silane, dichlorosilane, or tricholorsilane. Thicknesses TH1 and TH2 of semiconductive layer 19 are controlled by duration of the epitaxial growth.

Other epitaxial growth includes some processes such as solid-phase epitaxy (SPE) or selective epitaxy growth (SEG). The SPE process converts an amorphous region of semiconductor material to crystalline structure to form semiconductive layer 19. The semiconductive layer 19 includes silicon. The selective epitaxy growth (SEG) process involves growth and etch co-exist. In different epitaxy stages of SEG, some growth rates are greater than or smaller than some etching rates, and hence a corresponding net effect is growth or etching, respectively. SEG is performed using low pressure chemical vapor deposition (LPCVD) in a chamber.

The thicknesses TH1 and TH2 of semiconductive layer 19 are adjustable by controlling some etch to growth ratios throughout SEG process. Some process conditions including a type of process gases and a flow rate for a growth/etching process. The flow rate of the process gas is adjusted to control thicknesses TH1 and TH2 of semiconductive layer 19.

The LPCVD includes exposing surface S4 to a high vacuum. A gaseous flux including the process gas is directed onto surface S4 to deposit the process gas on the surface S4. The process gas is deposited with coverage of at least approximately one monolayer. In some embodiments, a material, such as Si, deposited on surface S4 is same with a material in fin structure 11 to form a homoepitaxy structure.

Liquid Phase Epitaxy (LPE) involves a precipitation of a crystalline film from a supersaturated melt on to surface S4. A temperature is increased until a phase transition occurs and then reduced for precipitation. By controlling some cooling rates, a rate of growth for semiconductive layer 19 is controlled. The cooling rates can be continuous or in a discrete increment level.

In some other embodiments, the epitaxial growth involves depositing a layer of some crystallizable elemental materials of semiconductive layer 19 on a lattice-mismatched target of surface S4 to produce a multi-atomic-layer on fin structures 11. Defects arise in some efforts to epitaxially grow one kind of crystalline material in semiconductive layer 19 on a different kind of material in fin structure 11. A crystalline lattice size of a material in semiconductive layer 19 can be different from that of a material in fin structure 11. This lattice mismatch between a starting fin structure 11 and subsequent layer(s) of semiconductive layer 19 creates stress during material deposition that generates defects in semiconductive layer 19.

Operation 441 forms a capping layer (not shown) on semiconductive layer 19 to form stress therein. Operation 451 performs a thermal anneal on the semiconductive layer 19 to form dislocation 12 in FIGS. 17Y and 17X.

The capping layer is blanket formed on top of semiconductive layer 19 and some portions of gate structure 14. The capping layer is overlying comformally following a contour of semiconductive layer 19 and of gate structure 14. Some materials of the capping layer include silicon nitride, titanium nitride, oxynitride, oxide, SiGe, SiC, SiON, and/or combinations thereof. The capping layer includes an inherent tensile stress or compressive stress. For a FinFET precursor 100 to be a p-type FinFET, the capping layer includes an inherent compressive stress. Conversely, for a FinFET precursor 100 to be an n-type FinFET, the capping layer includes an inherent tensile stress. A formation process of the capping layer is adjusted to tune a stress to a desirable value. The formation process is any suitable process such as atomic layer deposition (ALD), chemical vapor deposition (CVD), or physical vapor deposition (PVD), or the like. The capping layer including a silicon nitride is formed by a low pressure CVD (LPCVD), a silicon nitride is formed by a plasma enhanced CVD (PECVD), a tetraethyl orthosilicate is formed by a CVD process, a silicon oxide is formed by a high aspect ratio process (HARP).

In some embodiments, the PAI (not shown) is performed on the FinFET precursor 100 to create an amorphous region (not shown) within the capping layer and semiconductive layer 19. The amorphous region includes amorphous silicon, and some polysilicon grains. The portion 111 of fin structure 11 under gate structures 14 is protected from the PAI, and remains to have a crystalline structure. Portion 111 is illustrated in FIG. 16X since the top portion of fin structure 11 is removed.

In some embodiments, the PAI process is skipped such that a thermal anneal is performed on the FinFET precursor 100 after forming of the capping layer as illustrated in operation 441 to operation 451 in FIG. 13. In FIG. 13 the operation 451 performs the thermal anneal on the FinFET precursor 100. The thermal anneal is performed to form dislocation 12 near first corner 1C and second corner 2C. The thermal anneal is performed using Rapid Thermal Anneal (RTA), laser anneal, or other anneal methods. In some embodiment, the thermal anneal is performed using spike RTA. The thermal anneal can include a long range pre-heat.

As a result of the thermal anneal, semiconductive layer 19 is recrystallized with a memorized stress obtained from the capping layer. The capping layer is removed by any suitable process including a wet etching or a dry etching process. In another example, the capping layer is removed by a CMP process. The capping layer is removed with fin structures 11 retaining a stress effect. Retaining the stress effect is through operation 431, 441, and 451 in FIG. 13.

Figure 17Y:
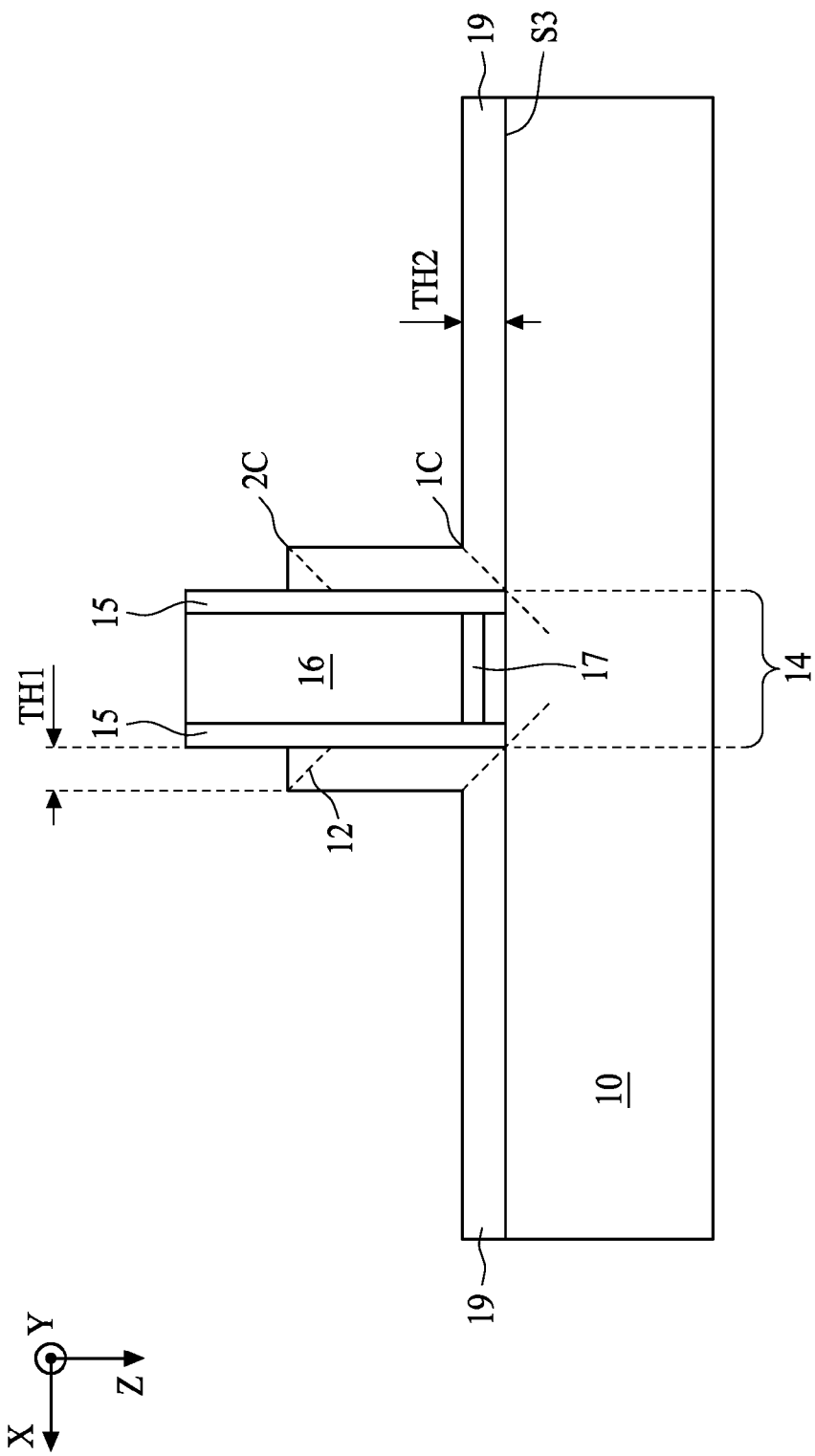
FIGS. 17X and 17Y are some cross-sectional views of an operation in a method for manufacturing a semiconductor device, in accordance with some embodiments.
Figure 17X:
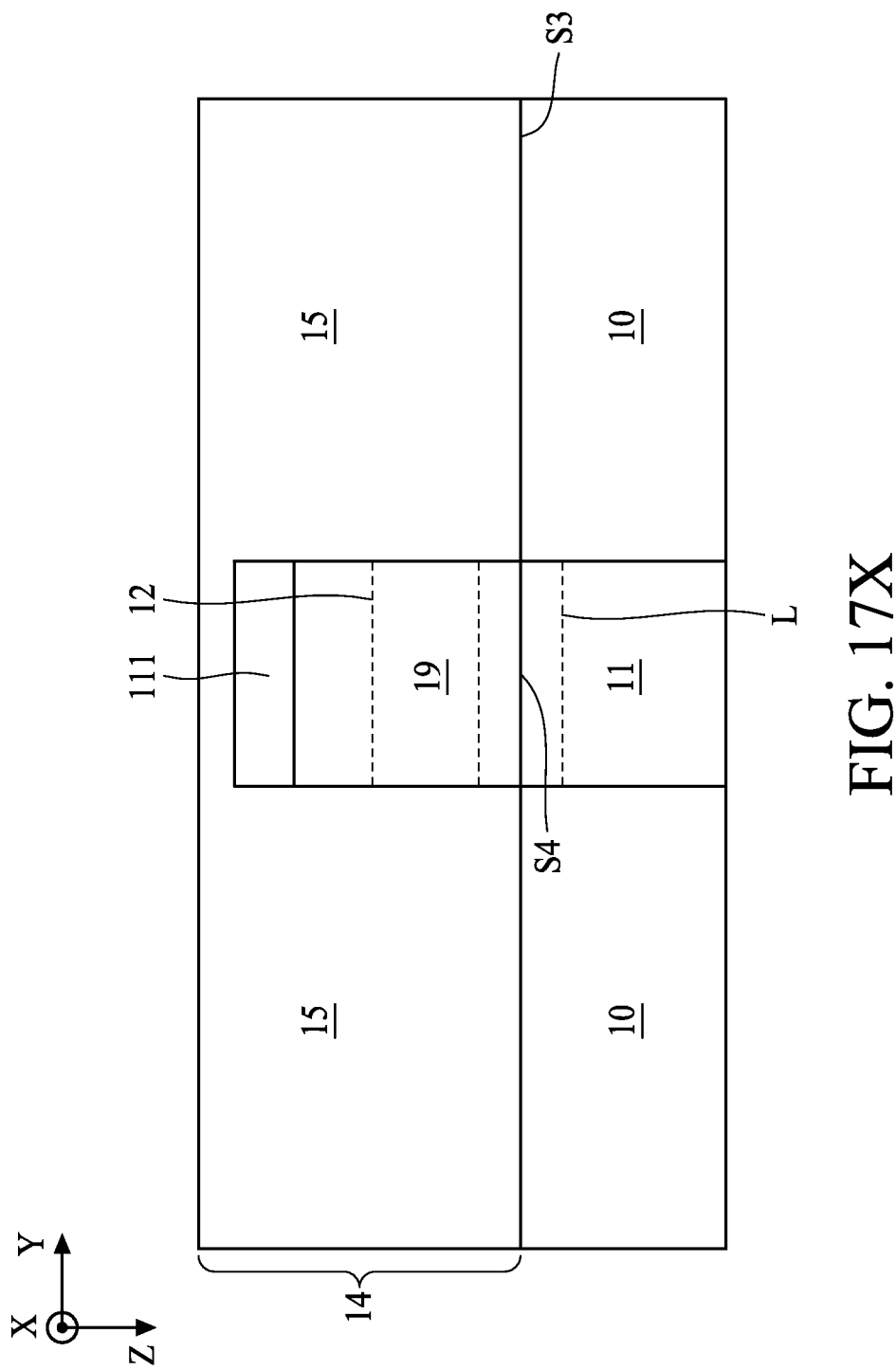

In FIGS. 17Y and 17X, dislocation 12 extends from the first corner 1C and the second corner 2C downward towards gate structure 14. Dislocation 12 reaches the portion 111 and the remaining portion of fin structure 11 below surface S3 of isolation region 10.

Removing the capping layer after dislocation 12 is formed. Dislocations 12 are formed within semiconductive layer 19 proximate to the first corner 1C and the second corner 2C. Dislocations 12 are nearly symmetrical on either side of the gate structure 14. Semiconductive layer 19 is removed with dislocation 12 remained in the portion 111 and the remaining portion of fin structure 11 below surface S3 of isolation region 10. Semiconductive layer 19 is removed by any suitable process including the lithography process and the etching process.

Figure 18Y:
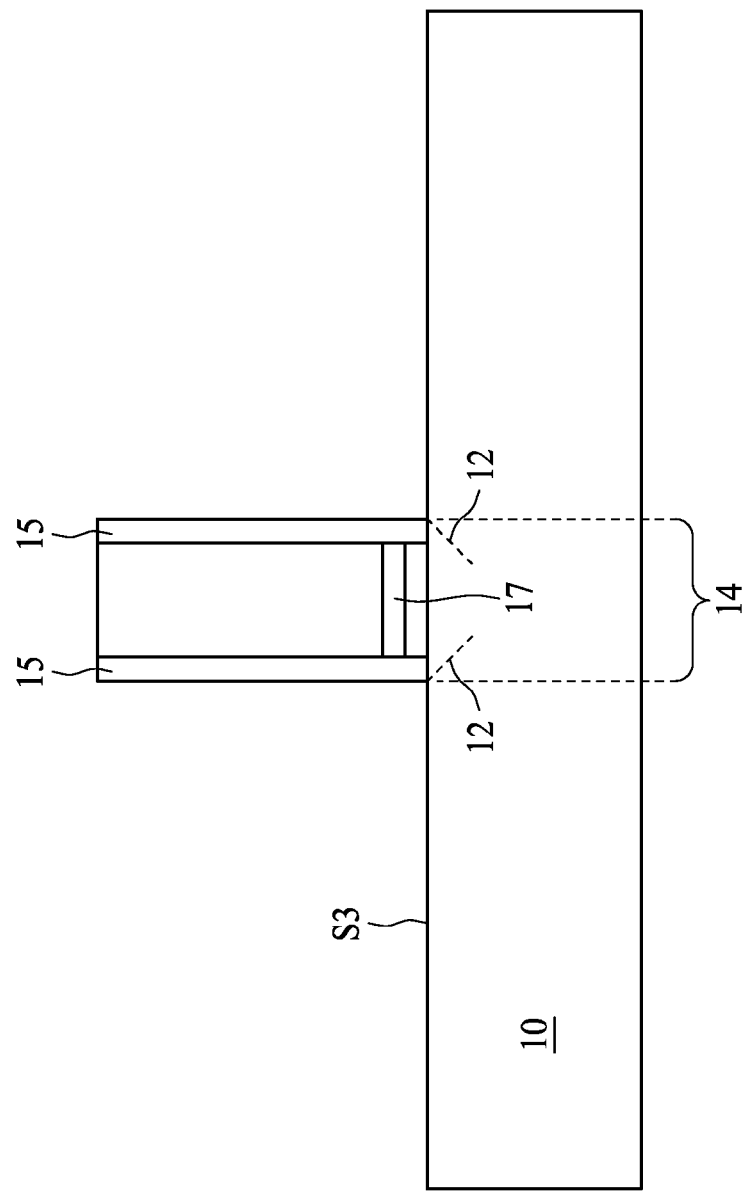
FIGS. 18X and 18Y are some cross-sectional views of an operation in a method for manufacturing a semiconductor device, in accordance with some embodiments.
Figure 18X:
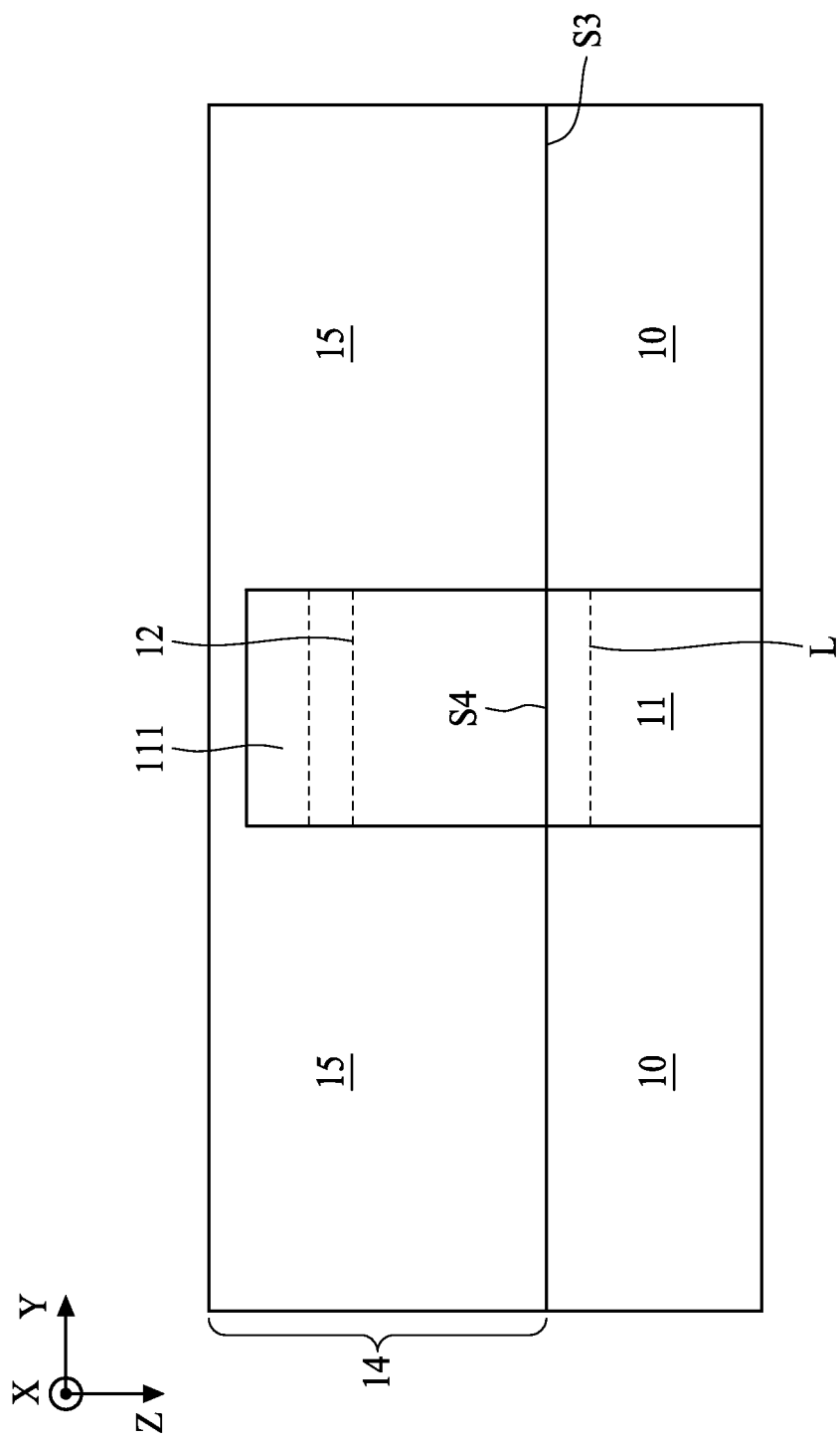

In FIGS. 18Y and 18X, some remaining portions of fin structure 11 are left. A surface S4 of the remaining portion can be above a surface S3 of isolation region 10, at a same level with surface S3, or below surface S3. Surface S4 and surface S3 are substantially flat. The portion 111 is exposed in FIG. 18X.

A lower edge L of dislocations 12 are under surface S4 of the remaining portion of fin structure 11. Dislocation 12 is left in the fin structure 11 in the portion 111. Dislocation 12 is shortened by the etching process as a plane formed by dislocation 12 is reduced in size. A level of surface S4 is determined by some process parameters in the etching process. Surface S4 can be above a surface S3 of isolation region 10, at a same level with surface S3, or below surface S3. Surface S4 and surface S3 are substantially flat.

A lower portion of dislocation 12 remains in fin structure 11. The lower portion is in a plane form and includes a lower edge L. The lower edge L is parallel to the second longitudinal axis, which is in direction Y. Dislocations 12 at both sides of the gate structure 14 are nearly symmetrical with respect to the gate structure 14. In some embodiments, a portion of semiconductive layer 19 is removed with a remaining portion (not shown) of semiconductive layer 19 on top of fin structure 11.

Figure 19:
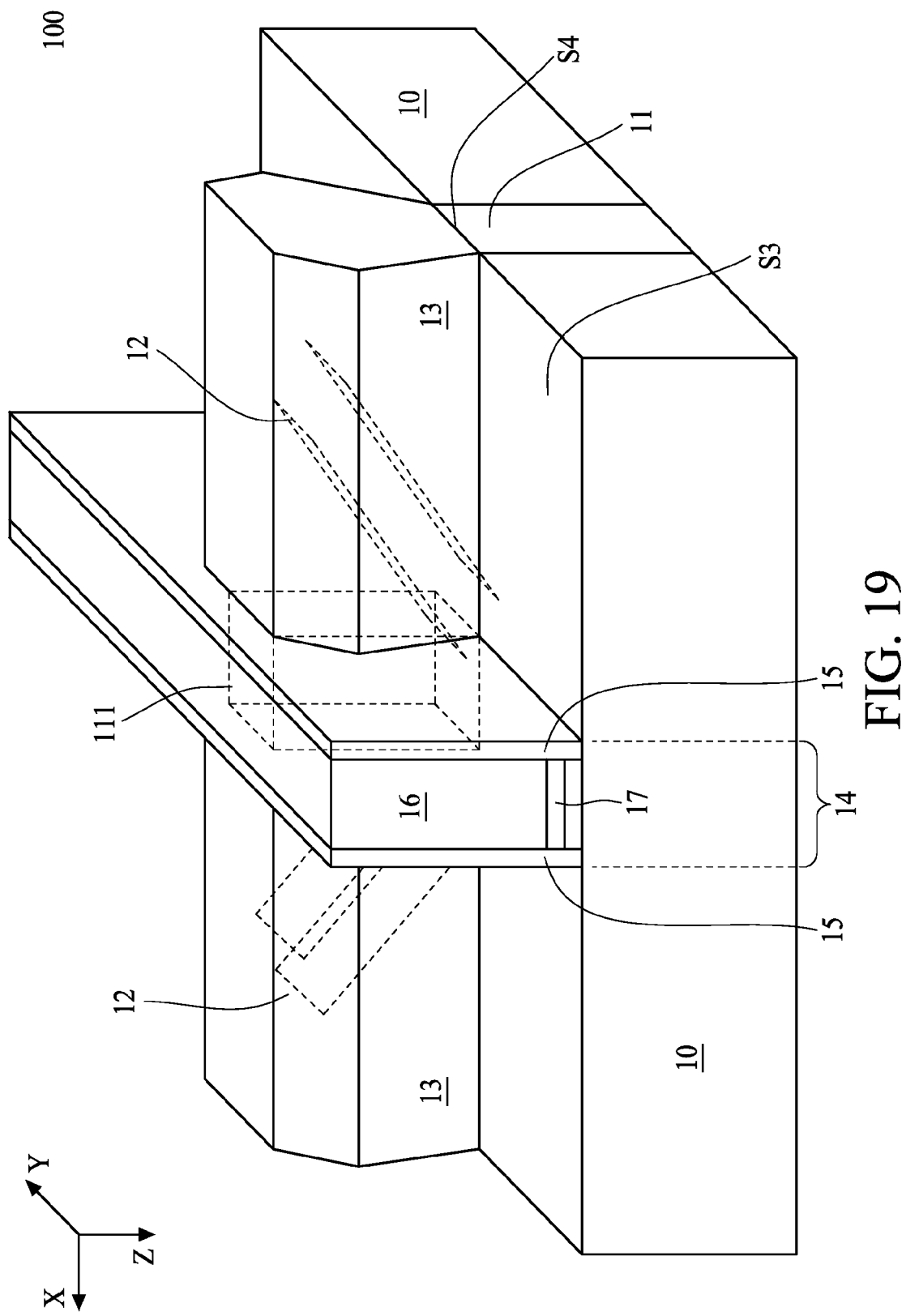
FIG. 19 is a diagrammatic perspective view of an operation in a method for manufacturing a semiconductor device, in accordance with some embodiments of the present disclosure.
Figure 19X:
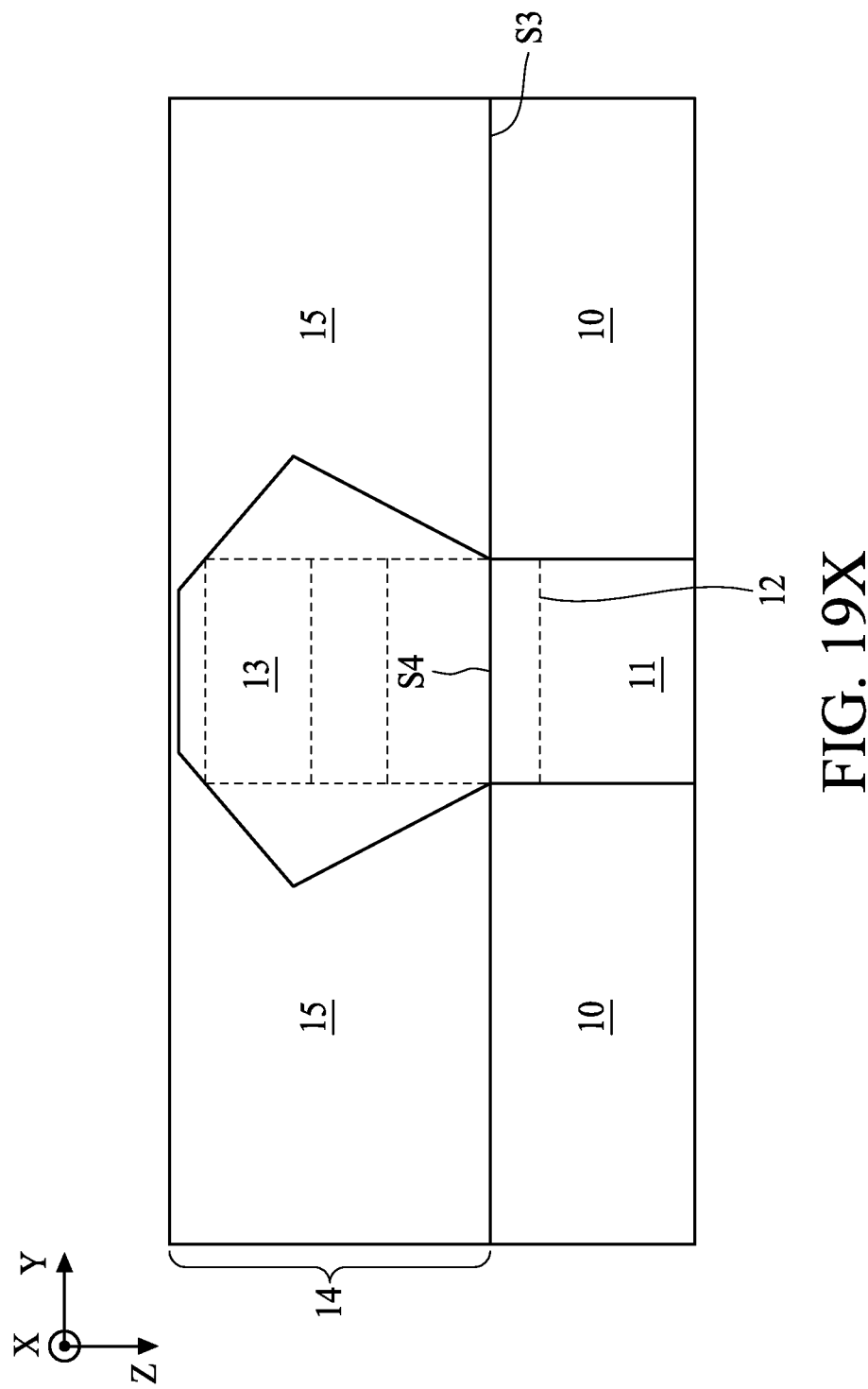

In FIGS. 19Y, 19X and 19, epitaxy region 13 is grown on top of the remaining portion of fin structure 11 and continues dislocation 12 into epitaxy region 13. Dislocation 12 formed inside epitaxy region 13 is parallel with dislocation 12 within fin structure 11.

Growing epitaxy region 13 is by any suitable method such as some epitaxy processes. The epitaxy process includes a process such as chemical vapor deposition CVD deposition techniques (e.g., vapor-phase epitaxy (VPE), metalorganic chemical vapor deposition CVD (MOCVD), ultra-high vacuum chemical vapor deposition (UHV-CVD), molecular-beam epitaxy (MBE), solid-phase epitaxy (SPE), liquid-phase epitaxy (LPE), selective epitaxy growth (SEG), and/or other suitable processes. The epitaxy process uses a process gas and/or liquid, which interacts with a composition of fin structure 11. Dislocation 12 is replicated from fin structure 11 into epitaxy region 13. In some embodiments, epitaxy region 13 is in-situ doped. Some doping species include p-type dopants, such as boron or BF2; n-type dopants, such as phosphorus or arsenic; and/or other suitable dopants including combinations thereof. In some other embodiments, epitaxy region 13 is not in-situ doped.

The SPE process converts an amorphous region of a semiconductor material to crystalline structure to form epitaxy region 13. The SEG process involves growth and etch co-exist. SEG is performed using low pressure chemical vapor deposition (LPCVD) in a chamber. The LPCVD includes exposing surface S4 to a high vacuum. A gaseous flux including the process gas is directed onto surface S4 to deposit the process gas on the surface S4.

A crystalline lattice size of a material in epitaxy layer 13 can be different from that a material in fin structure 11. This lattice mismatch between a starting fin structure 11 and subsequent layer(s) of epitaxy layer 13 creates stress during material deposition that propagates defects at dislocation 12 from fin structure 11 to epitaxy layer 13.

In efforts to epitaxially grow one kind of crystalline material on a surface of a different kind of material with dislocation 12, different crystalline lattice sizes of the two materials results to a lattice mismatch proximate to dislocation 12. This lattice mismatch between a starting surface such as surface S4, and subsequent layer such as epitaxy layer 13, creates stress during material deposition that replicates dislocation 12 into epitaxy layer 13.

Some embodiments of the present disclosure provide a method of manufacturing a semiconductor device including receiving a FinFET precursor including a fin structure formed between isolation regions, and a gate structure formed over a portion of the fin structure such that a sidewall of the fin structure is in contact with a gate spacer of the gate structure; patterning the fin structure to comprise at least one upward step rising from the isolation region; forming a capping layer over the fin structure, the isolation region, and the gate structure; performing an annealing process on the FinFET precursor to form at least two dislocations along the upward step; and removing the capping layer.

Some embodiments of the present disclosure provide a method of manufacturing a semiconductor device including receiving a FinFET precursor including a fin structure formed between some isolation regions, and a gate structure formed over a portion of the fin structure; removing a top portion of the fin structure on either side of the gate structure; growing a semiconductive layer on top of a remaining portion of the fin structure such that a plurality of corners is formed over the fin structure; forming a capping layer over the semiconductive layer; performing an annealing process on the FinFET precursor to form a plurality of dislocations proximate to the corners; and removing the capping layer.

Some embodiments of the present disclosure provide a semiconductor device including a fin structure between isolation regions. The fin structure includes a first longitudinal axis. A gate structure over a portion of the fin structure. The portion of the fin structure is in contact with a gate spacer. At least one epitaxy region disposed on top of the fin structure and in contact with the gate structure. A plurality of dislocations is formed within the epitaxy region and within the fin structure.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of manufacturing a semiconductor device comprising:
   receiving a FinFET precursor comprising:
      a fin structure formed between isolation regions; and
      a gate structure formed over a portion of the fin structure such that a sidewall of the fin structure is in contact with a gate spacer of the gate structure;
   patterning the fin structure to form a plurality of upward steps rising from the isolation region, wherein each of the plurality of upward steps comprises a top surface and a side surface connected to the top surface, and the top surfaces of the plurality of upward steps are located at different levels;
   forming a capping layer over the fin structure, the isolation region, and the gate structure;
   performing an annealing process on the FinFET precursor to form at least two dislocations along the upward step; and
   removing the capping layer.

2. The method of claim 1, further comprising removing a top portion of the fin structure and thereafter forming at least one epitaxy region on top of the fin structure.

3. The method of claim 2, wherein the operation of forming the epitaxy region comprises extending the dislocation into the epitaxy region.

4. The method of claim 1, wherein the plurality of upward steps include a bottom step proximate to the isolation region, and a top step proximate to a top surface of the gate structure.

5. The method of claim 1, wherein the operation of performing the annealing process comprises forming the dislocations such that the dislocation is nearly parallel with a nearby dislocation and the dislocation is extending to the portion of the fin structure and to a lower portion of the fin structure between the isolation regions.

6. The method of claim 1, wherein the operation of performing the annealing process comprises forming the dislocations at either side of the gate structure such that the dislocations are nearly symmetric on either side of the gate structure.

7. The method of claim 1, wherein the operation of forming the dislocations comprises forming the dislocations such that a lower portion of the dislocation is slanting towards the gate structure.

8. The method of claim 1, wherein the operation of forming the dislocations comprises forming the dislocations in a plane region.

9. The method of claim 1, further comprising performing a pre-amorphization implant (PAI) on the FinFET precursor by implanting some doping species.

10. A method of manufacturing a semiconductor device comprising:
    receiving a FinFET precursor comprising:
       a fin structure formed between isolation regions; and
       a gate structure formed over a portion of the fin structure such that a sidewall of the fin structure is in contact with a gate spacer of the gate structure;
    patterning the fin structure to form a plurality of upward steps rising from the isolation region, wherein each of the plurality of upward steps comprises a top surface and a side surface connected to the top surface, and the top surfaces of the plurality of upward steps are located at different levels;
    forming a capping layer following a contour of the upward steps;
    performing an annealing process on the FinFET precursor to form at least two dislocations along the upward step; and
    removing the capping layer.

11. The method of claim 10, further comprising removing a top portion of the fin structure and thereafter forming at least one epitaxy region on top of the fin structure, wherein the operation of forming the epitaxy region comprises extending the dislocation from the fin structure into the epitaxy region.

12. The method of claim 10, wherein the upward steps include a first corner and a second corner located at different levels, and the operation of performing the annealing process comprises forming the dislocations such that the dislocations are formed proximate to the first corner and the second corner.

13. The method of claim 10, wherein the operation of forming the dislocations comprises forming the dislocations at either side of the gate structure such that the dislocations are nearly symmetric on either side of the gate structure.

14. A method of manufacturing a semiconductor device comprising:
    receiving a FinFET precursor comprising:
       a fin structure formed between isolation regions; and
       a gate structure formed over a portion of the fin structure such that a sidewall of the fin structure is in contact with a gate spacer of the gate structure;
    patterning the fin structure to form a plurality of upward steps rising from the isolation region, wherein each of the plurality of upward steps comprises a top surface and a side surface connected to the top surface, and the top surfaces of the plurality of upward steps are located at different levels;
    forming a capping layer over the fin structure, the isolation region, and the gate structure, wherein the capping layer has a plurality of sub layers;
    performing an annealing process on the FinFET precursor to form at least two dislocations along the upward step; and
    removing the capping layer.

15. The method of claim 14, wherein the dislocations at one side of the gate structure are nearly parallel with each other.

16. The method of claim 14, wherein at least one epitaxy region disposed on the fin structure and in contact with the gate structure, and the dislocation is extended from the epitaxy region to the portion of the fin structure.

17. The method of claim 14, wherein the dislocations at both sides of the gate structure are nearly symmetrical with respect to the gate structure.

18. The method of claim 14, wherein the dislocations comprises a lower portion slanting towards the gate structure.

19. The method of claim 14, wherein the dislocation comprises a plane region.

20. The method of claim 19, wherein the fin structure comprises a first longitudinal axis, and the gate structure comprises a second longitudinal axis orthogonal to the first longitudinal axis, and the plane region comprises a lower edge parallel to the second longitudinal axis.

* * * * *